United States Patent
Fujioka et al.

(10) Patent No.: US 11,440,319 B2
(45) Date of Patent: Sep. 13, 2022

(54) LIQUID DISCHARGE HEAD, LIQUID DISCHARGE APPARATUS, AND METHOD OF MANUFACTURING LIQUID DISCHARGE HEAD

(71) Applicant: SEIKO EPSON CORPORATION, Tokyo (JP)

(72) Inventors: Masashi Fujioka, Minowa-machi (JP); Osamu Tonomura, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/941,064

(22) Filed: Jul. 28, 2020

(65) Prior Publication Data
US 2021/0031518 A1 Feb. 4, 2021

(30) Foreign Application Priority Data
Jul. 31, 2019 (JP) .............................. JP2019-140787

(51) Int. Cl.
*B41J 2/14* (2006.01)
*H01L 41/09* (2006.01)
*H01L 41/047* (2006.01)

(52) U.S. Cl.
CPC ........ *B41J 2/14233* (2013.01); *H01L 41/047* (2013.01); *H01L 41/0973* (2013.01); *B41J 2002/14241* (2013.01)

(58) Field of Classification Search
None
See application file for complete search history.

(56) References Cited

U.S. PATENT DOCUMENTS

| 2006/0109314 | A1* | 5/2006 | Cabal | B41J 2/1628 347/61 |
| 2009/0053402 | A1* | 2/2009 | Sekiguchi | B41J 2/1626 427/100 |
| 2016/0067967 | A1 | 3/2016 | Naganuma et al. | |
| 2016/0152028 | A1* | 6/2016 | Tanaka | B41J 2/1628 347/68 |
| 2019/0283424 | A1* | 9/2019 | McAvoy | B41J 2/1628 |

FOREIGN PATENT DOCUMENTS

JP 2016-058467 A 4/2016

* cited by examiner

*Primary Examiner* — Erica S Lin
(74) *Attorney, Agent, or Firm* — Workman Nydegger

(57) ABSTRACT

A liquid discharge head includes a first substrate in which a nozzle is formed, a second substrate disposed above the first substrate, an energy generation element that generates energy for discharging a liquid by a drive signal being applied, and a vibration plate that vibrates by the energy generated by the energy generation element and that is stacked on the second substrate, in which the vibration plate has a first area and a second area positioned at a position different from the first area and having a lower elastic modulus than an elastic modulus of the first area.

10 Claims, 30 Drawing Sheets

LIQUID DISCHARGE HEAD, LIQUID DISCHARGE APPARATUS, AND METHOD OF MANUFACTURING LIQUID DISCHARGE HEAD

The present application is based on, and claims priority from JP Application Serial Number 2019-140787, filed Jul. 31, 2019, the disclosure of which is hereby incorporated by reference herein its entirety.

BACKGROUND

1. Technical Field

The present disclosure relates to a liquid discharge head, a liquid discharge apparatus, and a method for manufacturing a liquid discharge head.

2. Related Art

A technology is proposed in related art, in which a vibration plate constituting a wall surface of a pressure chamber is vibrated by a piezoelectric element to discharge a liquid such as an ink filled in the pressure chamber from a nozzle. For example, a droplet discharge head described in JP-A-2016-58467 includes a vibration plate formed of an elastic film formed of silicon dioxide and an insulating film formed of zirconium oxide.

In the configuration of JP-A-2016-58467, a crack may occur in an area of a portion of the vibration plate. When a hardness of the entire area of the vibration plate is increased or a film thickness of the vibration plate is thickened to suppress an occurrence of such a crack, the vibration plate becomes difficult to deform. As a result, there is a possibility that discharge performance such as a discharge amount and a discharge speed of a liquid discharge head is reduced.

SUMMARY

According to an aspect of the present disclosure, a liquid discharge head includes a first substrate in which a nozzle is formed, a second substrate disposed above the first substrate, an energy generation element that generates energy for discharging a liquid by a drive signal being applied, and a vibration plate that vibrates by the energy generated by the energy generation element and that is stacked on the second substrate, in which the vibration plate has a first area and a second area positioned at a position different from the first area and having a lower elastic modulus than an elastic modulus of the first area.

According to another aspect of the present disclosure, a method for manufacturing a liquid discharge head includes a first step of forming a first layer containing silicon oxide containing silicon, a second step of stacking a zirconium-containing layer containing zirconium on the first layer, a third step of stacking a resist film provided with an opening on the zirconium-containing layer, a fourth step of removing a portion of the first layer and a portion of the zirconium-containing layer by etching using the resist film, a fifth step of removing the resist film, a sixth step of forming a second layer containing zirconium oxide by thermally oxidizing the zirconium-containing layer, and a seventh step of forming a third layer having a lower elastic modulus than an elastic modulus of zirconium oxide on the first layer.

DESCRIPTION OF EXEMPLARY EMBODIMENTS

1. First Embodiment

1-1. Overall Configuration of Liquid Discharge Apparatus 100

Figure 1:
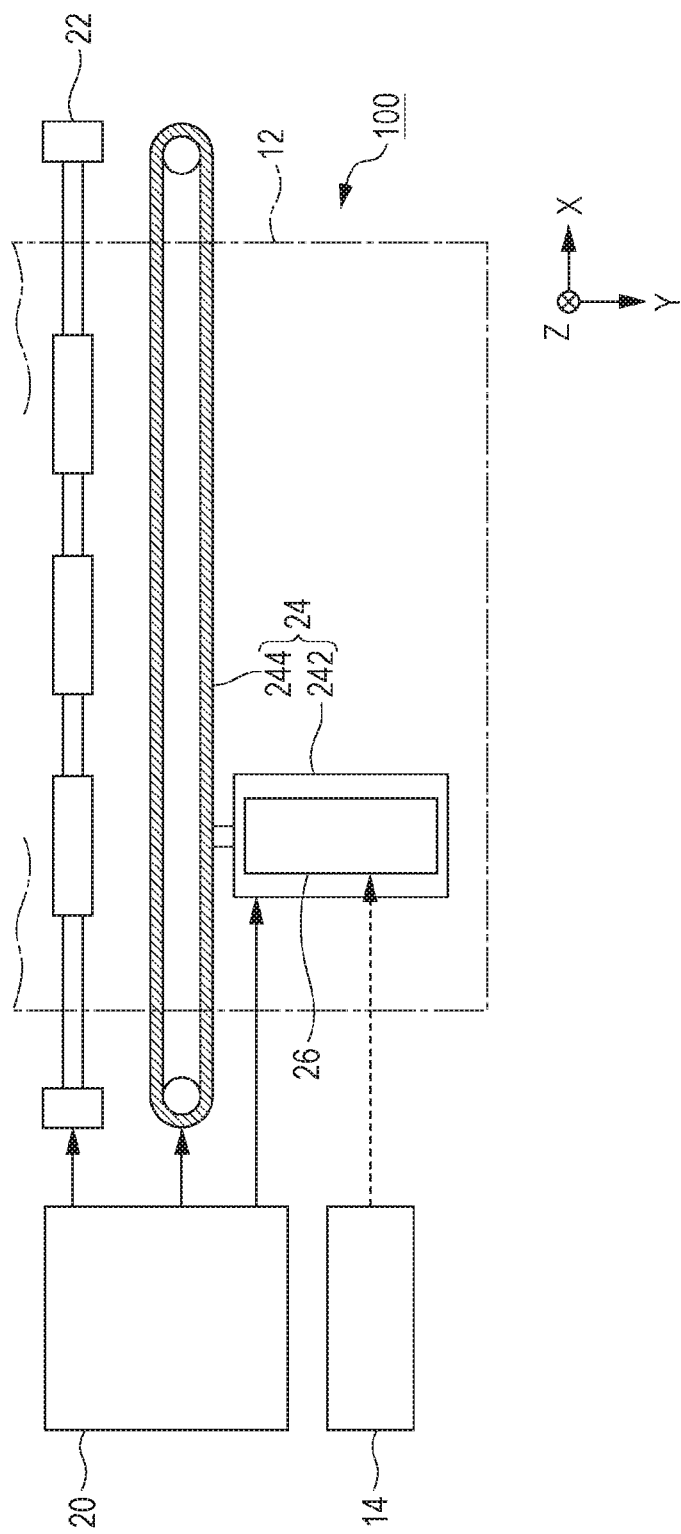
FIG. 1 is a block diagram illustrating a configuration of a liquid discharge apparatus according to a first embodiment.

FIG. 1 is a configuration diagram illustrating the liquid discharge apparatus 100 according to a first embodiment. In the following, for convenience of description, the description will be made by appropriately using an X-axis, a Y-axis, and a Z-axis. The X, Y, and Z axes are orthogonal to each other. Further, In the X-axis, a direction indicated by an arrow is defined as a +X direction, and the opposite direction is defined as −X direction. The same applies to the Y-axis and the Z-axis. A +Z direction is defined as "up" and the −Z direction is defined as "down". Further, in present disclosure, the expression "an element B is disposed above an element A" is not limited to a configuration in which the element A and the element B are in direct contact. A configuration in which the element A and the element B are not in direct contact with each other is also included in the concept of "an element B is disposed above an element A".

The liquid discharge apparatus 100 of the first embodiment is a printing apparatus of an ink jet method that discharges an ink, which is an example of a liquid, to a medium 12. The medium 12 is typically printing paper, but a printing target of an arbitrary material such as a resin film or cloth is used as the medium 12. As illustrated in FIG. 1, the liquid discharge apparatus 100 is provided with a liquid container 14 reserving an ink. For example, a cartridge detachable from the liquid discharge apparatus 100, a bag-shaped ink pack formed of a flexible film, or an ink tank capable of refilling an ink is used as the liquid container 14.

As illustrated in FIG. 1, the liquid discharge apparatus 100 includes a control unit 20, a transport mechanism 22, a movement mechanism 24, and a liquid discharge head 26. The control unit 20 is an example of a control portion". The control unit 20 includes, for example, one or a plurality of processing circuits such as a central processing unit (CPU) or a field programmable gate array (FPGA), and one or a plurality of storage circuits such as a semiconductor memory, and controls each element of the liquid discharge apparatus 100 in an integrated manner. For example, the control unit 20 controls an operation of the liquid discharge head 26.

The transport mechanism 22 transports the medium 12 in the +Y direction under the control of the control unit 20. The movement mechanism 24 causes the liquid discharge head 26 to reciprocate along the X-axis under the control of the control unit 20. The X-axis intersects the Y-axis along a direction in which the medium 12 is transported. The movement mechanism 24 of the first embodiment includes a substantially box-shaped transport body 242 that accommodates the liquid discharge head 26, and a transport belt 244 to which the transport body 242 is fixed. A configuration in which a plurality of the liquid discharge heads 26 are mounted on the transport body 242, or a configuration in which the liquid container 14 is mounted on the transport body 242 together with the liquid discharge head 26 can be adopted.

The liquid discharge head 26 discharges the ink supplied from the liquid container 14, from a plurality of nozzles to the medium 12 under the control of the control unit 20. Each liquid discharge head 26 discharges the ink to the medium 12 in parallel with the transport of the medium 12 by the transport mechanism 22 and the repetitive reciprocation of the transport body 242, so that an image is formed on a surface of the medium 12.

1-2. Overall Configuration of Liquid Discharge Head 26

Figure 2:
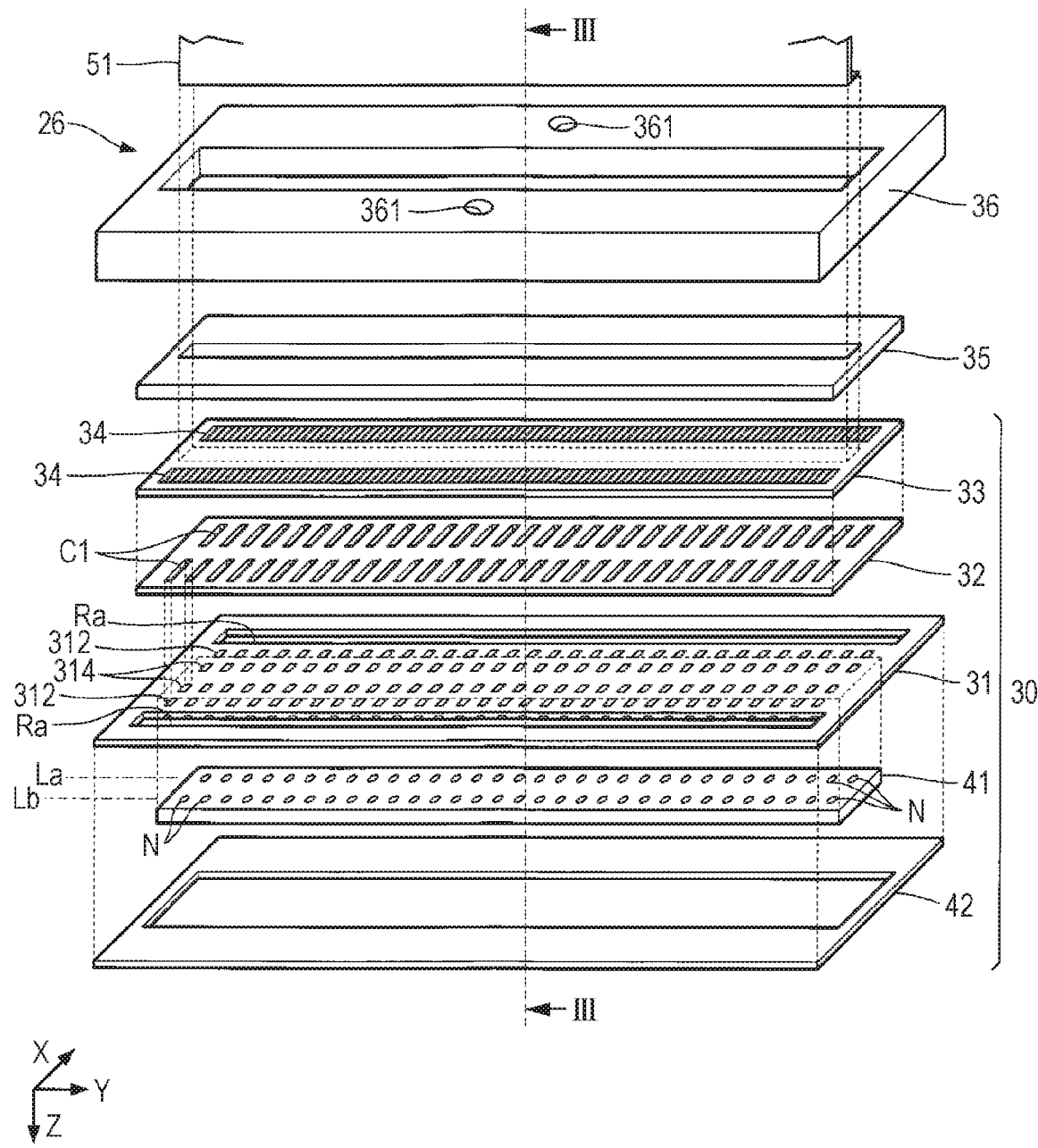
FIG. 2 is an exploded perspective view of a liquid discharge head.
Figure 3:
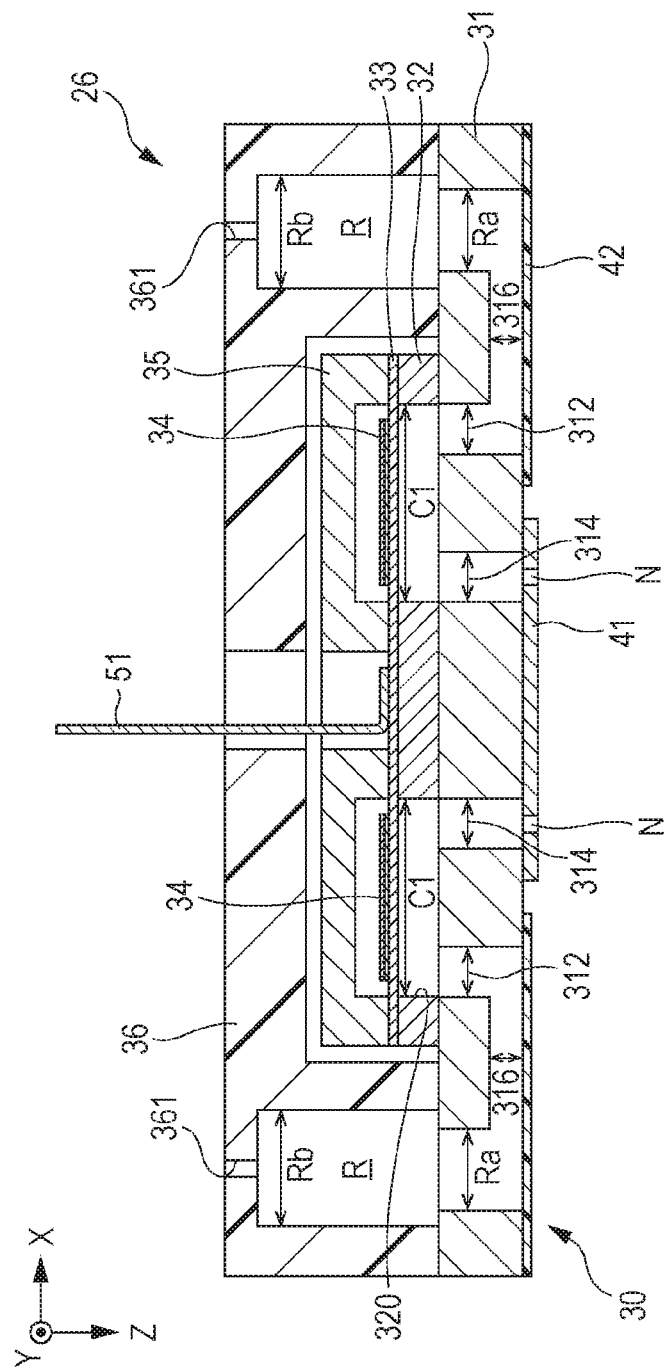
FIG. 3 is a sectional view of the liquid discharge head.

FIG. 2 is an exploded perspective view of the liquid discharge head 26. FIG. 3 is a sectional view taken along a line III-III in FIG. 2. A section illustrated in FIG. 3 is a section parallel to an X-Z plane. The Z-axis is an axis along an ink discharge direction by the liquid discharge head 26.

As illustrated in FIG. 2, the liquid discharge head 26 includes a plurality of nozzles N arranged along the Y-axis. The plurality of nozzles N of the first embodiment are divided into a first nozzle row La and a second nozzle row Lb arranged side by side at an interval from each other along the X-axis. Each of the first nozzle row La and the second nozzle row Lb is a set of the plurality of nozzles N arranged linearly along the Y-axis. The liquid discharge head 26 of the first embodiment has a structure in which an element related to each nozzle N in the first nozzle row La and an element related to each nozzle N in the second nozzle row Lb are disposed substantially in plane symmetry. Accordingly, in the following description, an element corresponding to the first nozzle row La will be mainly described, and the description of an element corresponding to the second nozzle row Lb will be appropriately omitted.

As illustrated in FIGS. 2 and 3, the liquid discharge head 26 includes a flow path structure body 30, a plurality of piezoelectric elements 34, a sealing body 35, a casing portion 36, and a wiring substrate 51. The flow path structure body 30 is a structure in which a flow path for supplying an ink to each of the plurality of nozzles N is formed. The flow path structure body 30 includes a flow path substrate 31, a pressure chamber substrate 32, a vibration plate 33, a nozzle plate 41, and a vibration absorber 42. The nozzle plate 41 is an example of a "first substrate". The pressure chamber substrate 32 is an example of a "second substrate". Each member constituting the flow path structure body 30 is a long plate-shaped member along the Y-axis. The pressure chamber substrate 32 and the casing portion 36 are provided on the surface of the flow path substrate 31 on a side of the +Z-axis. On the other hand, the nozzle plate 41 and the vibration absorber 42 are provided on the surface of the flow path substrate 31 on a side of the −Z-axis. Accordingly, the pressure chamber substrate 32 is disposed above the nozzle plate 41. Further, each member is fixed by, for example, an adhesive.

The nozzle plate 41 is a plate-shaped member on which the plurality of nozzles N are formed. Each of the plurality of nozzles N is a circular through hole discharging the ink. For example, the nozzle plate 41 is manufactured by processing a single crystal substrate of silicon (Si) using a semiconductor manufacturing technology such as photolithography and etching. However, a known material and a manufacturing method can be arbitrarily adopted for manufacturing the nozzle plate 41.

As illustrated in FIGS. 2 and 3, a space Ra, a plurality of supply flow paths 312, a plurality of communication flow paths 314, and a relay liquid chamber 316 are formed in the flow path substrate 31. The space Ra is an opening formed in a long shape along the Y-axis. Each of the supply flow path 312 and the communication flow path 314 is a through hole formed for each nozzle N. The relay liquid chamber 316 is a long-shaped space formed along the Y-axis over the plurality of nozzles N, and allows the space Ra and the plurality of supply flow paths 312 to communicate with each other. Each of the plurality of communication flow paths 314 overlaps one nozzle N corresponding to the communication flow path 314 in plan view as viewed from the +Z direction.

As illustrated in FIGS. 2 and 3, a plurality of pressure chambers C1 are formed on the pressure chamber substrate 32. The pressure chamber C1 is positioned between the nozzle plate 41 and the vibration plate 33. The pressure chamber C1 is a space formed by a wall surface 320 of the pressure chamber substrate 32. The pressure chamber C1 is a long-shaped space along the X-axis in plan view. The pressure chamber C1 is formed for each nozzle N. The plurality of pressure chambers C1 are arranged along the Y-axis. The flow path substrate 31 and the pressure chamber substrate 32 are manufactured by processing a single crystal substrate of silicon using, for example, a semiconductor manufacturing technology, similarly to the nozzle plate 41 described above. However, a known material and a manufacturing method can be arbitrarily adopted for manufacturing the flow path substrate 31 and the pressure chamber substrate 32.

As illustrated in FIG. 3, the elastically deformable vibration plate 33 is disposed above the pressure chamber C1. The vibration plate 33 is stacked on the pressure chamber substrate 32 and is in contact with a surface of the pressure chamber substrate 32 opposite to the flow path substrate 31. The vibration plate 33 is a plate-shaped member formed in a long rectangular shape along the Y-axis in plan view. A thickness direction of the vibration plate 33 is parallel to a direction along the Z-axis. As illustrated in FIGS. 2 and 3, the pressure chamber C1 communicates with the communication flow path 314 and the supply flow path 312. Accordingly, the pressure chamber C1 communicates with the nozzle N via the communication flow path 314, and communicates with the space Ra via the supply flow path 312 and the relay liquid chamber 316. In FIG. 2, the pressure chamber substrate 32 and the vibration plate 33 are illustrated as separate substrates for ease of explanation, but in practice, are stacked on one silicon substrate as described in a manufacturing method described later. A portion or the entirety of the vibration plate 33 may be a separate member from the pressure chamber substrate 32 or may be integrated.

As illustrated in FIGS. 2 and 3, the piezoelectric element 34 is formed for each pressure chamber C1 on the surface of the vibration plate 33 opposite to the pressure chamber C1. The piezoelectric element 34 is a long-shaped passive element along the X-axis in plan view. The piezoelectric element 34 is an example of an "energy generation element". The piezoelectric element 34 generates energy for discharging an ink by a drive signal being applied. Here, a piezoelectric element that generates mechanical energy is described as an "energy generation element", but an electrothermal conversion element that generates thermal energy may be used as long as a system has a vibration plate 33. Further, the piezoelectric element 34 is also a driving element that is driven by a drive signal being applied.

The casing portion 36 in FIG. 3 is a case for reserving an ink supplied to the plurality of pressure chambers C1, and is formed by, for example, injection molding of a resin material. A space Rb and a supply port 361 are formed in the casing portion 36. The supply port 361 is a pipeline to which an ink is supplied from the liquid container 14, and communicates with the space Rb. The space Rb of the casing portion 36 and the space Ra of the flow path substrate 31 communicate with each other. A space formed by the space Ra and the space Rb functions as a liquid reserve chamber R that reserves an ink supplied to the plurality of pressure chambers C1. The ink supplied from the liquid container 14 and has passed through the supply port 361 is reserved in the liquid reserve chamber R. The ink reserved in the liquid reserve chamber R branches from the relay liquid chamber 316 to each supply flow path 312, and is supplied to and filled into a plurality of pressure chambers C1 in parallel. The vibration absorber 42 is a flexible film or sheet constituting a wall surface of the liquid reserve chamber R, and absorbs a pressure fluctuation of the ink in the liquid reserve chamber R.

The sealing body 35 is a structure that protects the plurality of piezoelectric elements 34 and reinforces the mechanical strength of the pressure chamber substrate 32 and the vibration plate 33, and is fixed to the surface of the vibration plate 33 by an adhesive, for example. The plurality of piezoelectric elements 34 are disposed in an interior side of a recess portion formed on a facing surface with respect to the vibration plate 33 in the sealing body 35. Further, the wiring substrate 51 is bonded to a surface of the vibration plate 33. The wiring substrate 51 is a mounting component on which a plurality of wirings for electrically coupling the control unit 20 and the liquid discharge head 26 are formed. For example, the flexible wiring substrate 51 such as a flexible printed circuit (FPC) or a flexible flat cable (FFC) is suitably adopted. A drive signal for driving the piezoelectric element 34 and a reference voltage are supplied to each piezoelectric element 34 from the wiring substrate 51.

1-3. Configuration of Piezoelectric Element 34

Figure 4:
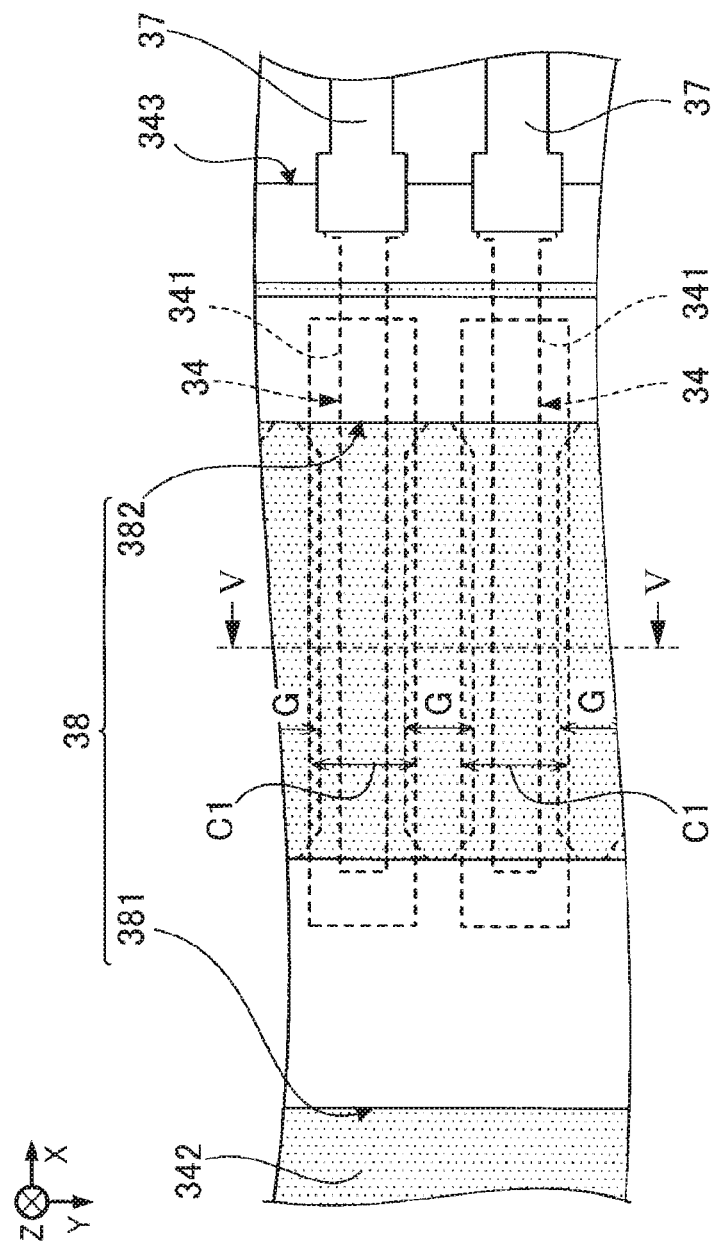
FIG. 4 is a plan view of a piezoelectric element and its vicinity.

FIG. 4 is a plan view of the piezoelectric element 34 and its vicinity. In FIG. 4, dots are attached to a second electrode 342 described later for convenience. Further, FIG. 5 is a sectional view taken along a line V-V in FIG. 4.

Figure 5:
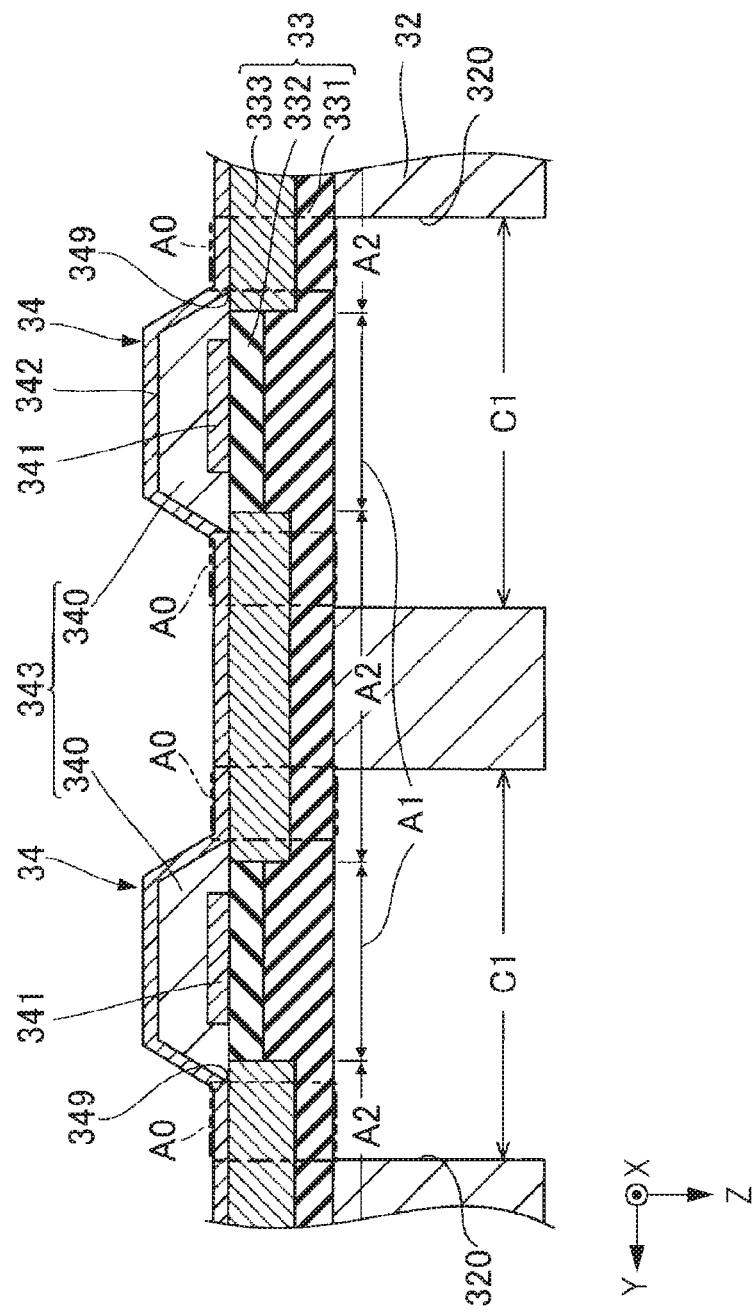
FIG. 5 is a sectional view taken along a line V-V in FIG. 4.

As illustrated in FIGS. 4 and 5, the piezoelectric element 34 is a structure body in which a first electrode 341, a piezoelectric body 343, and the second electrode 342 are stacked in the above order from a side of the vibration plate 33. The Z-axis corresponds to an axis along a direction in which the first electrode 341, the piezoelectric body 343, and the second electrode 342 are stacked. In the present disclosure, the expression "an element B is formed on the surface of an element A" is not limited to a configuration in which the element A and the element B are in direct contact. That is, even in a configuration in which an element C is formed on the surface of the element A and the element B is formed on the surface of the element C, when the configuration is such that a portion or entirety of the element A and the element B overlap in plan view, the configuration is included in the concept of "an element B is formed on the surface of an element A".

As illustrated in FIG. 5, the first electrode 341 is formed on the surface of the vibration plate 33. The first electrode 341 is an individual electrode formed apart from each other for each piezoelectric element 34. As illustrated in FIG. 4, the first electrode 341 has a long shape along the X-axis. A plurality of first electrodes 341 are arranged along the Y-axis at an interval from each other. The first electrode 341 is formed of, for example, a conductive material such as platinum (Pt) or iridium (Ir). A first wiring 37 is electrically coupled to the first electrode 341. The first wiring 37 is a lead wiring to which a drive signal is supplied from a drive circuit (not illustrated) mounted on the wiring substrate 51 illustrated in FIG. 3, and supplies the drive signal to the first electrode 341. The first wiring 37 is formed of a conductive material having a lower resistance than the first electrode 341. For example, the first wiring 37 is a conductive pattern having a structure in which a conductive film of gold (Au) is stacked on a surface of a conductive film formed of nichrome (NiCr).

The piezoelectric body 343 illustrated in FIGS. 4 and 5 is formed above the first electrode 341 and is in contact with the first electrode 341. The piezoelectric body 343 illustrated in FIG. 4 is a strip-shaped dielectric film that extends along the Y-axis over the plurality of piezoelectric elements 34. The piezoelectric body 343 is formed of a known piezoelectric material such as, for example, lead zirconate titanate (Pb(Zr, Ti)O$_3$). A portion of the piezoelectric body 343 is in contact with the vibration plate 33. A notch G along the X-axis is formed in an area of the piezoelectric body 343 corresponding to a gap between the pressure chambers C1 adjacent to each other. The notch G is an opening that penetrates the piezoelectric body 343. By forming the notch G, each piezoelectric element 34 is individually deformed for each pressure chamber C1, and propagation of vibration between the piezoelectric elements 34 is suppressed. A bottomed hole obtained by removing a portion of the piezoelectric body 343 in a thickness direction may be formed as the notch G.

As illustrated in FIG. 5, the piezoelectric body 343 has a plurality of piezoelectric body portions 340 that are individually separated for each pressure chamber C1 by the notch G. The piezoelectric body portion 340 is provided for each pressure chamber C1, and overlaps the pressure chamber C1 in plan view. It can be also said that the piezoelectric body 343 is a layer in which the plurality of piezoelectric body portions 340 are integrally formed. An arrangement direction of the plurality of piezoelectric body portions 340 coincides with a direction along the Y-axis.

As illustrated in FIG. 5, the second electrode 342 is formed above the piezoelectric body 343 and is in contact with the piezoelectric body 343. As illustrated in FIG. 4, the second electrode 342 is a strip-shaped common electrode extending along the Y-axis to be continuous over the plurality of piezoelectric elements 34. A predetermined reference voltage is applied to the second electrode 342. The reference voltage is a constant voltage, and is, for example, set to a voltage higher than a ground voltage. A voltage corresponding to a difference between a reference voltage applied to the second electrode 342 and a drive signal supplied to the first electrode 341 is applied to the piezoelectric body 343. A ground voltage may be applied to the second electrode 342. Further, the second electrode 342 is formed of, for example, a low-resistance conductive material such as platinum (Pt) or iridium (Ir).

As illustrated in FIG. 4, a second wiring 38 that is electrically coupled to the second electrode 342 is formed on a surface of the second electrode 342. A reference voltage (not illustrated) is supplied to the second wiring 38 via a wiring substrate 51 illustrated in FIG. 3. As illustrated in FIG. 4, the second wiring 38 has a strip-shaped first conductive layer 381 extending along the Y-axis and a strip-shaped second conductive layer 382 extending along the Y-axis. The first conductive layer 381 and the second conductive layer 382 are aligned at a predetermined interval along the X-axis. The first conductive layer 381 and the second conductive layer 382 are provided, so that a voltage drop of a reference voltage in the second electrode 342 is suppressed. Further, the first conductive layer 381 and the second conductive layer 382 also function as weights for suppressing the vibration of the vibration plate 33. The second wiring 38 is formed of a conductive material having a lower resistance than the second electrode 342. For example, the second wiring 38 is a conductive pattern having a structure in which a conductive film of gold (Au) is stacked on a surface of a conductive film formed of nichrome (NiCr).

The piezoelectric body 343 is deformed by applying a voltage between the first electrode 341 and the second electrode 342, so that the piezoelectric element 34 generates energy for bending and deforming the vibration plate 33. The vibration plate 33 vibrates by the energy generated by the piezoelectric element 34. By the vibration of the vibration plate 33, the pressure of the pressure chamber C1 changes and the ink in the pressure chamber C1 is discharged from the nozzle N illustrated in FIG. 3.

1-4. Configuration of Vibration Plate 33

Figure 6:
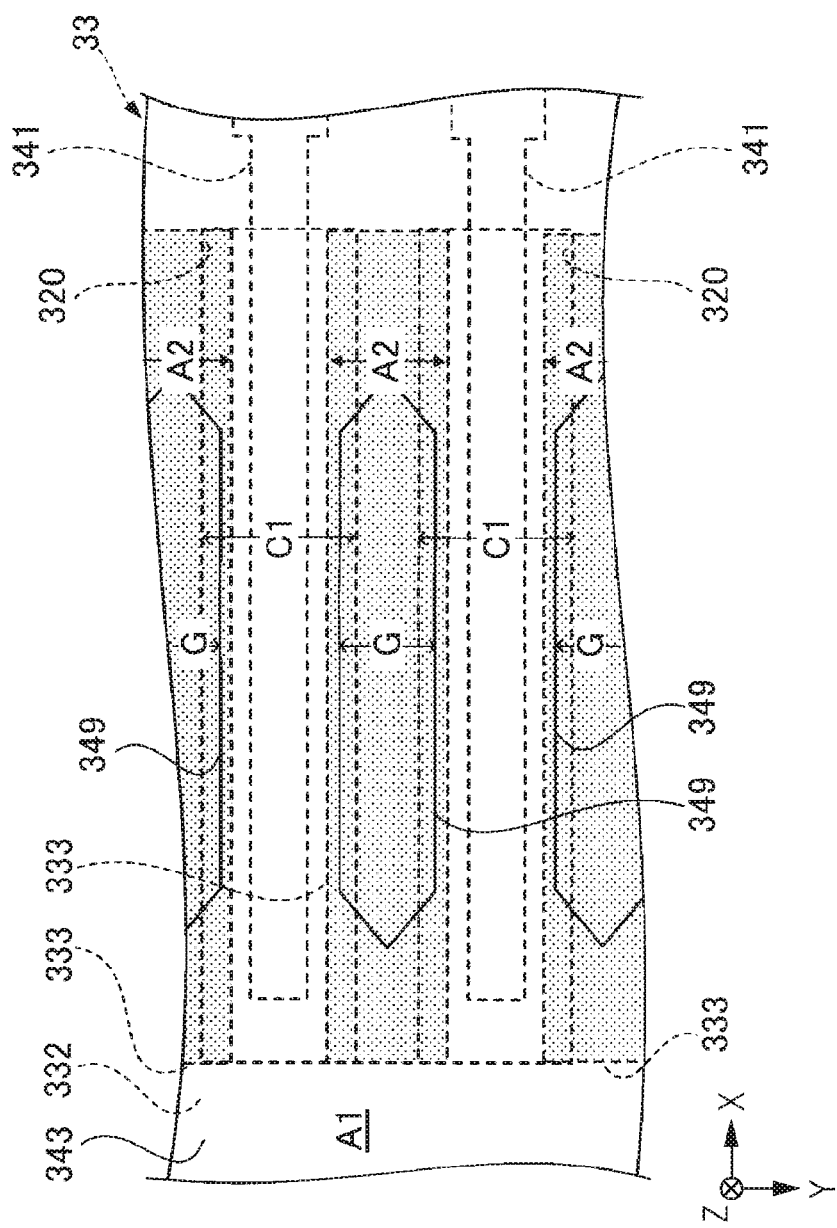
FIG. 6 is an enlarged plan view of a portion of a vibration plate and a piezoelectric body.

The vibration plate 33 will be described with reference to FIGS. 5 and 6. FIG. 6 is an enlarged plan view of a portion of the vibration plate 33 and the piezoelectric body 343. In FIG. 6, illustration of the second electrode 342 is omitted. In FIG. 6, dots are attached to a second area A2 described later for convenience.

As illustrated in FIG. 5, the vibration plate 33 includes a first layer 331, a second layer 332, and a third layer 333. The first layer 331 is stacked on the pressure chamber substrate 32. The first layer 331 has a portion that is in contact with the pressure chamber substrate 32 and a portion that overlaps the pressure chamber C1 in plan view. The first layer 331 is, for example, an elastic film formed of silicon oxide such as silicon dioxide (SiO$_2$).

The second layer 332 is stacked on the first layer 331. The second layer 332 is in contact with the piezoelectric element 34. Specifically, the second layer 332 is in contact with both the first electrode 341 and the piezoelectric body 343. The second layer 332 is, for example, an insulating layer formed of zirconium oxide such as zirconium dioxide (ZrO$_2$).

The third layer 333 is in contact with both the first layer 331 and the second layer 332. The third layer 333 penetrates through the second layer 332 and is disposed from the upper surface of the first layer 331 to a midway of the first layer 331 in a thickness direction. An upper surface of the third layer 333 and an upper surface of the second layer 332 are positioned on the same plane. That is, a planar surface is formed by the upper surface of the third layer 333 and the upper surface of the second layer 332. Further, the third layer 333 is in contact with the second electrode 342 and the piezoelectric body 343. The third layer 333 is not in contact with the first electrode 341.

As a material constituting the third layer 333, for example, a metal such as gold, silver, copper, platinum, iron, nickel, chromium, titanium, iridium, tantalum, and aluminum, or an alloy such as stainless steel containing a plurality of types of the metal is used. The material constituting the third layer 333 may be, for example, resin or rubber. Further, the third layer 333 may be formed of a composite material containing two or more different materials such as ceramics and metal.

As illustrated in FIG. 5, a film thickness of the third layer 333 is thicker than each of a film thickness of the first layer 331 and a film thickness of the second layer 332. Further, the film thickness of the first layer 331 is thicker than the film thickness of the second layer 332, but may be equal to or thinner than the film thickness of the second layer 332.

As illustrated in FIGS. 5 and 6, the vibration plate 33 is divided, in the Y direction, into a first area A1 and a plurality of second areas A2 provided at positions different from the first area A1. In the example illustrated in FIG. 6, the first area A1 surrounds the second area A2 and overlaps the pressure chamber C1 in plan view. The first area A1 does not necessarily have to surround the second area A2, and the first area A1 and the second area A2 may be separated in the Y direction. For example, the first area A1 may extend over the entire area of the vibration plate 33 in the X direction (the second area A2 does not exist at an end portion in the X direction).

The second area A2 has a rectangular shape in plan view, and overlaps the notch G in plan view. As illustrated in FIG. 5, the second area A2 is provided for each piezoelectric element 34. The first layer 331 and the second layer 332 are provided in the first area A1. The first layer 331 and the third layer 333 are provided in the second area A2. It can be also said that the second area A2 is an area in which the third layer 333 is provided.

At the same position in the +Z direction, an elastic modulus of a layer constituting the vibration plate 33 in the second area A2 is lower than an elastic modulus of a layer constituting the vibration plate 33 in the first area A1. Specifically, an elastic modulus of the third layer 333 is higher than an elastic modulus of the first layer 331. In the present embodiment, the elastic modulus of the third layer 333 is lower than an elastic modulus of the second layer 332. Further, from another viewpoint, an apparent elastic modulus in the second area A2 of the vibration plate 33 is lower than an apparent elastic modulus in the first area A1 of the vibration plate 33. The apparent elastic modulus is an elastic modulus in consideration of the thickness of the vibration plate 33. The elastic modulus is a value represented by F/L when considering a deflection amount L of the vibration plate 33 when a certain stress F is applied. In other words, the lower the elastic modulus, the more easily the deflection occurs (the higher the ductility). An example of the elastic modulus includes a tensile modulus, a shear modulus, a bulk modulus, and a rigidity modulus. Tensile modulus is also referred to as Young's modulus.

As described above, the elastic modulus in the second area A2 is lower than the elastic modulus in the first area A1, and thus it is possible to suppress an occurrence of a crack in the vibration plate 33 by the driving of the piezoelectric element 34. That is, by setting the second area A2 in a portion in which the crack is likely to occur, it is possible to suppress the occurrence of the crack in the vibration plate 33. Further, by having the second area A2, it is possible to suppress a capacity fluctuation of the pressure chamber C1 from being reduced since the vibration plate 33 is unlikely to bend compared to a case where the entire area of the vibration plate 33 is constituted by the second area A2. From this, by having the first area A1 and the second area A2 having different elastic moduli, it is possible to suppress the occurrence of the crack in the vibration plate 33 by the vibration of the piezoelectric element 34 while securing a necessary deformation amount of the vibration plate 33. Accordingly, it is possible to provide the liquid discharge head 26 in which deterioration of discharge performance can be suppressed and the piezoelectric element 34 is hardly damaged.

As illustrated in FIG. 5, the second area A2 includes an arm-shaped arm A0 that supports a portion overlapping the pressure chamber C1 in plan view. The arm A0 is a portion between the wall surface 320 and an end 349 of the piezoelectric element 34 in plan view in a direction along the Y-axis. The arm A0 is a portion of the vibration plate 33 in which the piezoelectric body 343 does not overlap the pressure chamber substrate 32 in plan view in a direction along the Y-axis. The arm A0 has a low mechanical strength compared to a portion overlapping the piezoelectric body 343. Accordingly, the second area A2 overlaps the arm A0 in plan view, so that it is possible to further reduce the occurrence of the crack in the vibration plate 33. Further, when the entire surface of the vibration plate 33 is covered with the piezoelectric body 343 without providing the notch G, the vibration plate 33 becomes extremely difficult to vibrate. Accordingly, driving efficiency is reduced. Accordingly, the piezoelectric body 343 may be not stacked on the second area A2 to suppress a decrease in driving efficiency. The end 349 is an edge of the piezoelectric element 34 in a direction along the Y-axis. In the present embodiment, the end 349 is an edge of the piezoelectric body portion 340 on a side of the +X-axis or on a side of the −X-axis. Since the piezoelectric body 343 has the notch G, it can be also said that the end 349 is an inner edge of the notch G of the piezoelectric body 343 in a direction along the Y-axis.

The second area A2 is closer to the wall surface 320 of the pressure chamber substrate 32 than the first area A1 in a direction along the Y-axis. Further, a distance between the second area A2 and the wall surface 320 is shorter than a distance between the first area A1 and the wall surface 320. Here, a portion of the vibration plate 33 that overlaps the wall surface 320 in plan view is likely to be broken due to concentration of tensile stress when the piezoelectric element 34 is driven. Accordingly, the second area A2 is close to the wall surface 320, so that an occurrence of a crack in the vibration plate 33 can be effectively suppressed. On the other hand, the first area A1 is far from the wall surface 320 and positioned at a position including a center of the pressure chamber C1 in the Y direction. Accordingly, it is possible to suppress the vibration plate 33 from becoming difficult to vibrate, and to suppress a decrease in discharge performance.

Further, the second area A2 overlaps the wall surface 320 of the pressure chamber substrate 32 in plan view in a direction along the Y-axis. The second area A2 straddles the wall surface 320 of the pressure chamber substrate 32 in plan view. On the other hand, the first area A1 does not overlap the wall surface 320 in plan view.

The second area A2 is closer to the end 349 of the piezoelectric element 34 than the first area A1 in a direction along the Y-axis. Further, a distance between the second area A2 and the end 349 of the piezoelectric element 34 is shorter than a distance between the first area A1 and the end 349 of the piezoelectric element 34. Here, a boundary between a portion of the vibration plate 33 that is in contact with the piezoelectric body 343 of the piezoelectric element 34 and a portion that is not in contact is a starting point in which tensile stress is concentrated when the piezoelectric element 34 is driven and breakage is likely to occur. Accordingly, the second area A2 is close to the end 349 of the piezoelectric element 34, so that an occurrence of a crack in the vibration plate 33 can be effectively suppressed. On the other hand, the first area A1 is far from the end 349 and positioned at a position including a center of the pressure chamber C1 in the Y direction. Accordingly, it is possible to suppress the vibration plate 33 from becoming difficult to vibrate, and to suppress a decrease in discharge performance.

Further, the second area A2 overlaps the end 349 of the piezoelectric element 34 in plan view in a direction along the Y-axis. The second area A2 straddles the end 349 of the piezoelectric element 34 in plan view. On the other hand, the first area A1 does not overlap the end 349 of the piezoelectric element 34 in plan view.

As illustrated in FIG. 5, the third layer 333 is in contact with the end 349 of the piezoelectric element 34. At the boundary between the portion in which the vibration plate 33 is in contact with the piezoelectric body 343 and the portion in which the vibration plate 33 is not in contact, stress is likely to be particularly concentrated by the driving of the piezoelectric element 34. Accordingly, the third layer 333 is in contact with the end 349 of the piezoelectric element 34, so that the occurrence of a crack in the vibration plate 33 can be effectively suppressed.

Each disposition of the first area A1 and the second area A2 is not limited to the illustrated example. However, the second area A2 may be disposed in a portion of the vibration plate 33 in which a crack is likely to occur. That is, the third layer 333 may be disposed in a portion of the vibration plate 33 in which a crack is likely to occur.

Further, as described above, the first area A1 has the first layer 331 containing silicon oxide. Silicon oxide contains silicon and oxygen of $SiO_2$ or the like. However, the silicon oxide may contain a small amount of boron (B), phosphorus (P), or the like. The first area A1 has the first layer 331 containing silicon oxide, so that the vibration plate 33 is easily vibrated according to the driving of the piezoelectric element 34.

On the other hand, the second area A2 has a third layer 333 containing any of gold, silver, copper, platinum, iron, nickel, chromium, titanium, iridium, tantalum, and aluminum. The first area A1 does not include a metal such as gold, silver, copper, platinum, iron, nickel, chromium, titanium, iridium, tantalum, and aluminum. The second area A2 includes any of these metals, so that it is easy to set an elastic modulus of a material constituting the third layer 333 to be lower than an elastic modulus of a material constituting the second layer 332. Accordingly, an occurrence of a crack in the vibration plate 33 can be suppressed. Further, a metal having an elastic modulus lower than an elastic modulus of zirconium oxide may be included. By using the metal, the occurrence of a crack in the vibration plate 33 can be particularly effectively suppressed. Further, the third layer 333 contains a material having conductivity such as a metal, so that a voltage drop of a reference voltage can be particularly suppressed.

The third layer 333 may not be in contact with the second electrode 342, and an insulating film that insulates the third layer 333 from the second electrode 342 may be disposed between the third layer 333 and the second electrode 342. Further, the third layer 333 may be constituted with a plurality of layers. For example, a layer in contact with the second electrode 342 may be an adhesion layer formed of a material having excellent adhesion between the third layer 333 and the second electrode 342. Specifically, for example, the third layer 333 can be constituted with a stacked structure of a layer containing aluminum and a layer containing iridium.

Further, the third layer 333 may be formed of a ductile material. The third layer 333 is formed from a ductile material, so that the resistance of the third layer 333 to tensile stress increases, and the time until a crack occurs in the vibration plate 33 increases. A boundary between a portion of the vibration plate 33 that is in contact with the piezoelectric body 343 and the portion that is not in contact is a starting point in which tensile stress is concentrated when the piezoelectric element 34 is driven and breakage is likely to occur. Accordingly, as in the present embodiment, the third layer 333 is in contact with the end 349 of the piezoelectric body 343 in plan view in a direction along the Y-axis, so that it is possible to suppress the occurrence of a crack in the vibration plate 33. In addition, the third layer 333 is disposed to overlap the arm A0 in a direction along the Y-axis in plan view, so that it is possible to particularly suppress the occurrence of a crack in the vibration plate 33. The first layer 331 and the second layer 332 are formed of a brittle material.

As described above, the liquid discharge head 26 that operates under the control of the control unit 20 can suppress the deterioration of discharge performance, and is less likely to cause damage to the vibration plate 33 and the piezoelectric element 34. Accordingly, according to the liquid discharge apparatus 100, highly precise liquid discharge can be stably realized for a long period of time.

Further, as the plurality of nozzles N are disposed at a higher density, a thickness of the vibration plate 33 tends to be smaller to secure a necessary deformation amount in the vibration plate 33. In this case, the thickness of the vibration plate 33 is reduced, so that a crack easily occurs in the vibration plate 33. According to the liquid discharge head 26, although the density of the nozzle N is increased, an occurrence of damage such as a crack at the vibration plate 33 by the vibration of the piezoelectric element 34 can be reduced while securing the necessary deformation amount of the vibration plate 33.

1-5. Manufacturing Method of Vibration Plate 33

Figure 7:
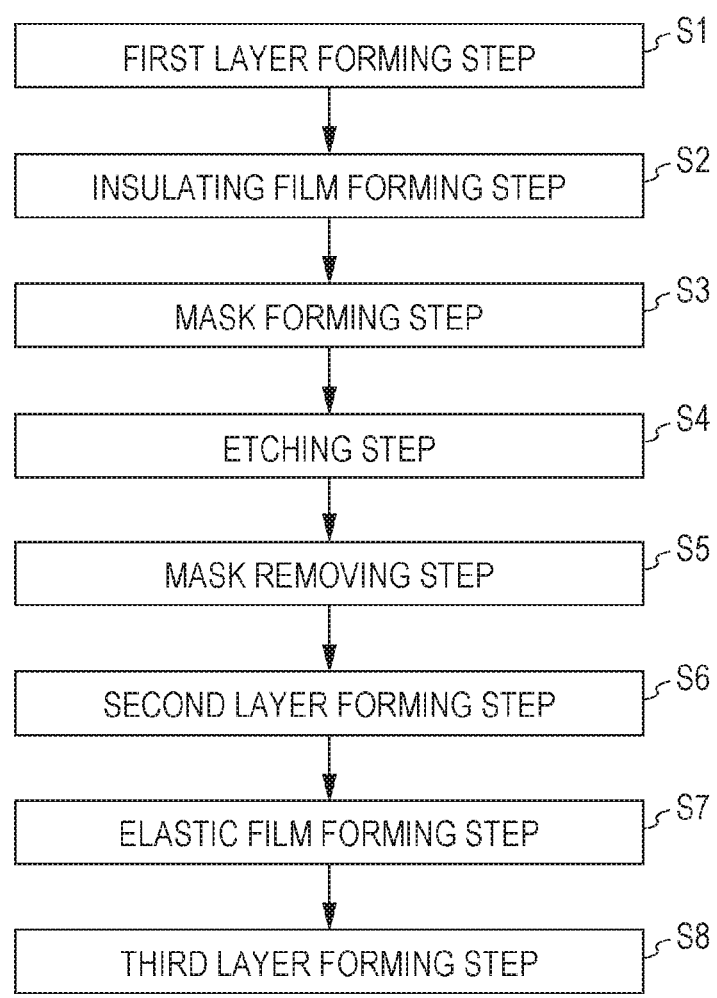
FIG. 7 is a flowchart illustrating a flow of manufacturing steps of the vibration plate.

FIG. 7 is a flowchart illustrating a flow of manufacturing steps of the vibration plate 33. As illustrated in FIG. 7, the manufacturing steps of the vibration plate 33 includes a first layer forming step S1, an insulating film forming step S2, a mask forming step S3, an etching step S4, a mask removing step S5, a second layer forming step S6, an elastic film forming step S7, and a third layer forming step S8. Hereinafter, each step will be described sequentially.

Figure 8:
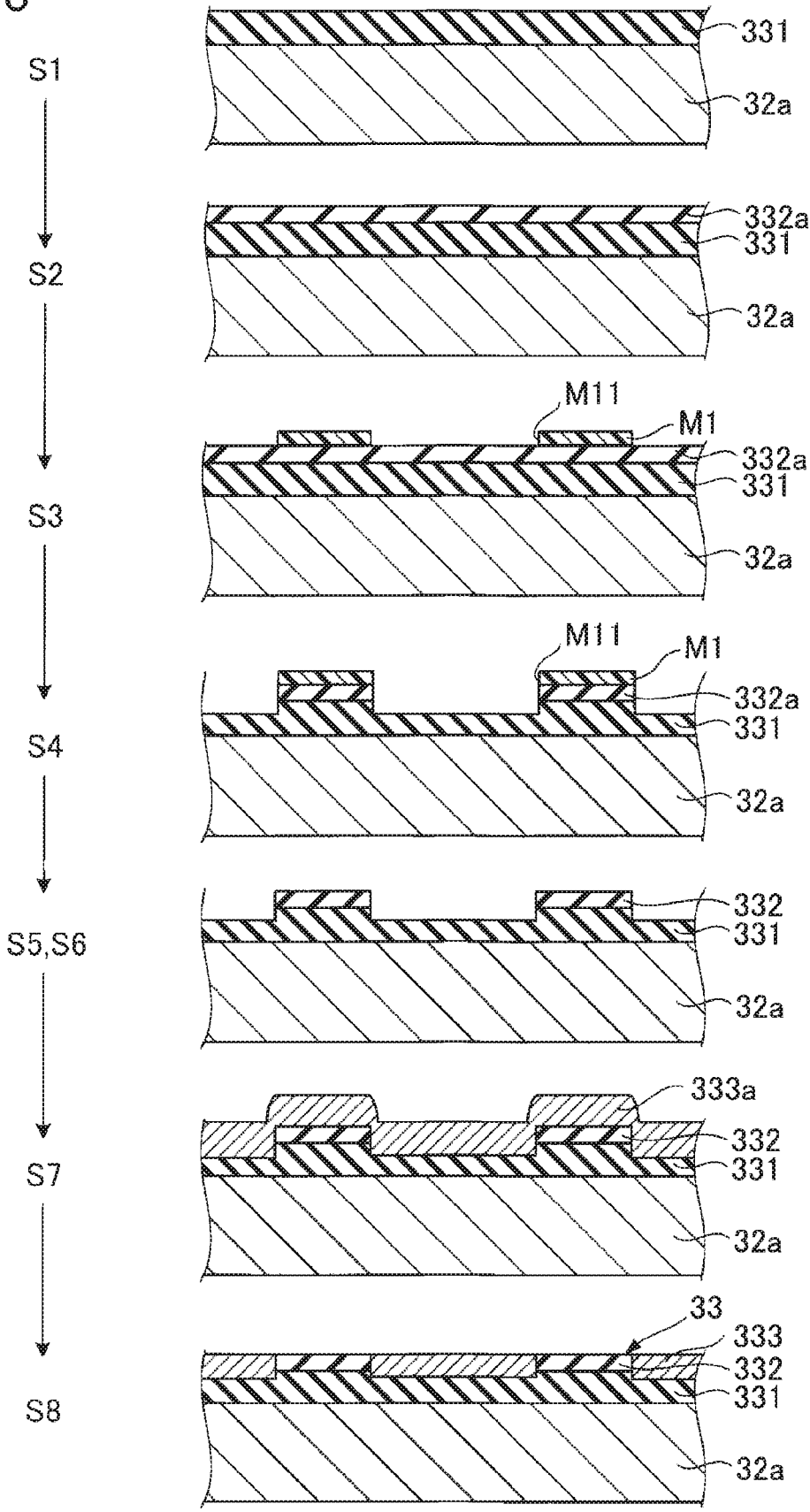
FIG. 8 is a sectional view illustrating each step of the vibration plate.

FIG. 8 is a sectional view illustrating each step of the vibration plate 33. As illustrated in FIG. 8, in the first layer forming step S1, a substrate 32a and the first layer 331 are formed by thermally oxidizing an upper surface of a silicon substrate such as a silicon single crystal substrate. The substrate 32a is a silicon substrate. The first layer 331 contains, for example, silicon oxide. The substrate 32a finally becomes the pressure chamber substrate 32. The first layer forming step S1 corresponds to a "first step".

In the insulating film forming step S2, an insulating film 332a is stacked on an upper surface of the first layer 331 by, for example, sputtering. The insulating film 332a is, for example, a zirconium-containing layer containing zirconium. The insulating film forming step S2 corresponds to a "second step".

In the mask forming step S3, a mask M1 provided with an opening M11 is formed on an upper surface of the insulating film 332a. For example, by patterning a photoresist using a photomask or the like, the mask M1 formed of a resist film is stacked on the insulating film 332a. The opening M11 corresponds to the second area A2 described above. That is, the opening M11 corresponds to the third layer 333. The mask forming step S3 corresponds to a "third step".

In the etching step S4, a portion of the insulating film 332a and a portion of the first layer 331 are removed by etching or the like using the mask M1. The etching may be wet etching or dry etching. The etching step S4 corresponds to a "fourth step".

In a mask removing step S5, the mask M1 is removed. The mask removing step S5 corresponds to a "fifth step". Further, in the second layer forming step S6, for example, a second layer 332 containing zirconium oxide is formed by thermally oxidizing the insulating film 332a that is a zirconium-containing layer. The second layer forming step S6 corresponds to a "sixth step".

In the elastic film forming step S7, an elastic film 333a is formed on the first layer 331. Specifically, the elastic film 333a containing, for example, various metals or the like is stacked on a surface of the first layer 331 and a surface of the second layer 332. The elastic film 333a is formed by a known film forming technology, for example, such as sputtering. Examples of the various metals include gold, silver, copper, platinum, iron, nickel, chromium, titanium, iridium, tantalum, aluminum, or the like. An elastic modulus of a material constituting the elastic film 333a is lower than each of the elastic moduli of materials constituting the second layer 332.

As illustrated in FIG. 8, in the third layer forming step S8, the elastic film 333a is polished by, for example, chemical mechanical polishing (CMP) or the like, so that the elastic film 333a is thinned. Due to the thinning, an upper surface of the elastic film 333a and the upper surface of the second layer 332 are planarized. By being planarized, the third layer 333 positioned at the same position as the second layer 332 in the +Z direction can be formed. The elastic film forming step S7 and the third layer forming step S8 correspond to a "seventh step". The elastic film forming step S7 described above is a step of stacking the third layer 333, and the third layer forming step S8 may be regarded as a step of planarizing the upper surface of the second layer 332 and the upper surface of the third layer 333.

Through the above steps, the vibration plate 33 is obtained. As described above, the manufacturing method of the vibration plate 33 includes the first layer forming step S1, the insulating film forming step S2, the mask forming step S3, the etching step S4, the mask removing step S5, the second layer forming step S6, the elastic film forming step S7, and the third layer forming step S8. According to such a manufacturing method, the vibration plate 33 having the first area A1 and the second area A2 can be reliably and easily formed by the first layer 331, the second layer 332, and the third layer 333. Accordingly, according to such a manufacturing method, the vibration plate 33 can be reliably and easily obtained in which a crack is less likely to occur by the vibration of the piezoelectric element 34 while securing a necessary deformation amount. The third layer forming step S8 may be omitted as appropriate. For example, when the elastic film 333a is formed to be a film only between the second layers 332 in the elastic film forming step S7, the third layer forming step S8 may be omitted.

The provision of the third layer 333 in the present embodiment is especially effective when the adhesion between a material constituting the third layer 333 and a material constituting the first layer 331 is larger than the adhesion between the material constituting the third layer 333 and a material constituting the second layer 332. High adhesion also means that interface free energy is high.

Figure 9:
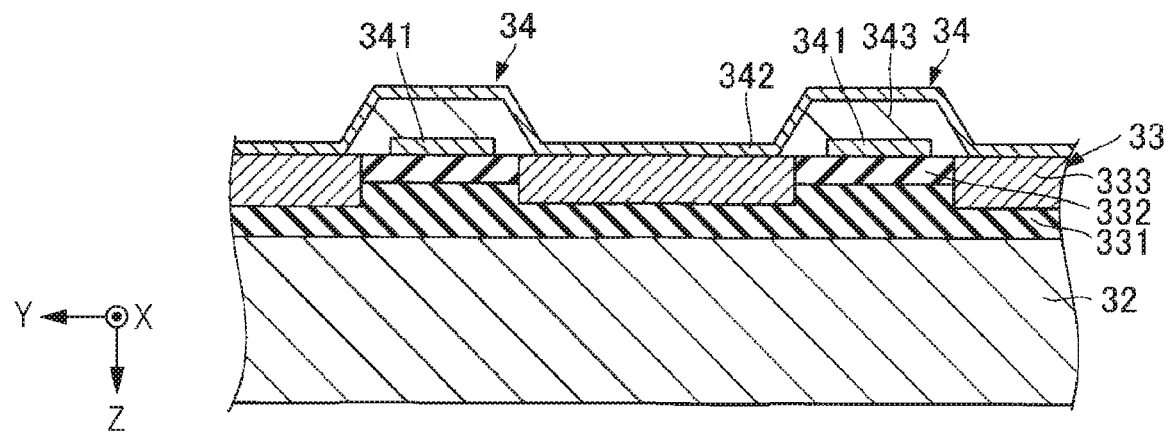
FIG. 9 is a sectional view illustrating a forming step of the piezoelectric element.

FIG. 9 is a sectional view illustrating a forming step of the piezoelectric element 34. As illustrated in FIG. 9, the piezoelectric element 34 is formed above the vibration plate 33. Specifically, the first electrode 341, the piezoelectric body 343, and a second electrode 342 are formed in this order on the upper surface of the vibration plate 33. The first electrode 341, the piezoelectric body 343, and the second electrode 342 are formed by, for example, a known film forming technology such as sputtering, and a known processing technology using photolithography, etching, or the like, respectively.

Figure 10:
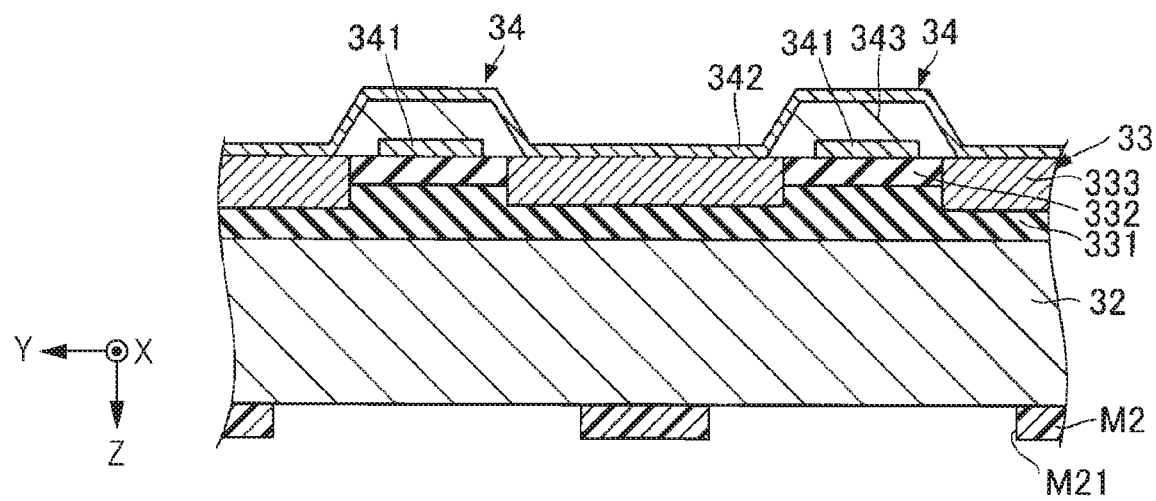
FIG. 10 is a sectional view for explaining a forming step of a pressure chamber substrate.

FIG. 10 is a sectional view for explaining a forming step of the pressure chamber substrate 32. As illustrated in FIG. 10, after the formation of the piezoelectric element 34, a mask M2 provided with an opening M21 is formed on a lower surface of the substrate 32a. The opening M21 corresponds to the pressure chamber C1. The mask M2 is obtained by patterning a photoresist using a photomask or the like. The pressure chamber substrate 32 provided with the pressure chamber C1 illustrated in FIG. 5 is formed by removing a portion of the substrate 32a by etching or the like using the mask M2. After the pressure chamber substrate 32 is formed, the piezoelectric element 34 may be formed.

After the pressure chamber substrate 32 is formed, the flow path substrate 31 and the nozzle plate 41 are formed below the pressure chamber substrate 32 by a known processing technology using photolithography, etching, or the like. Accordingly, the flow path structure body 30 is formed. As described above, the flow path structure body 30 including the vibration plate 33 can be formed.

2. Second Embodiment

A second embodiment will be described. In each of the following examples, the elements having the same functions as those of the first embodiment will be denoted by the same reference numerals used in the description of the first embodiment, and detailed description thereof will be omitted as appropriate.

Figure 11:
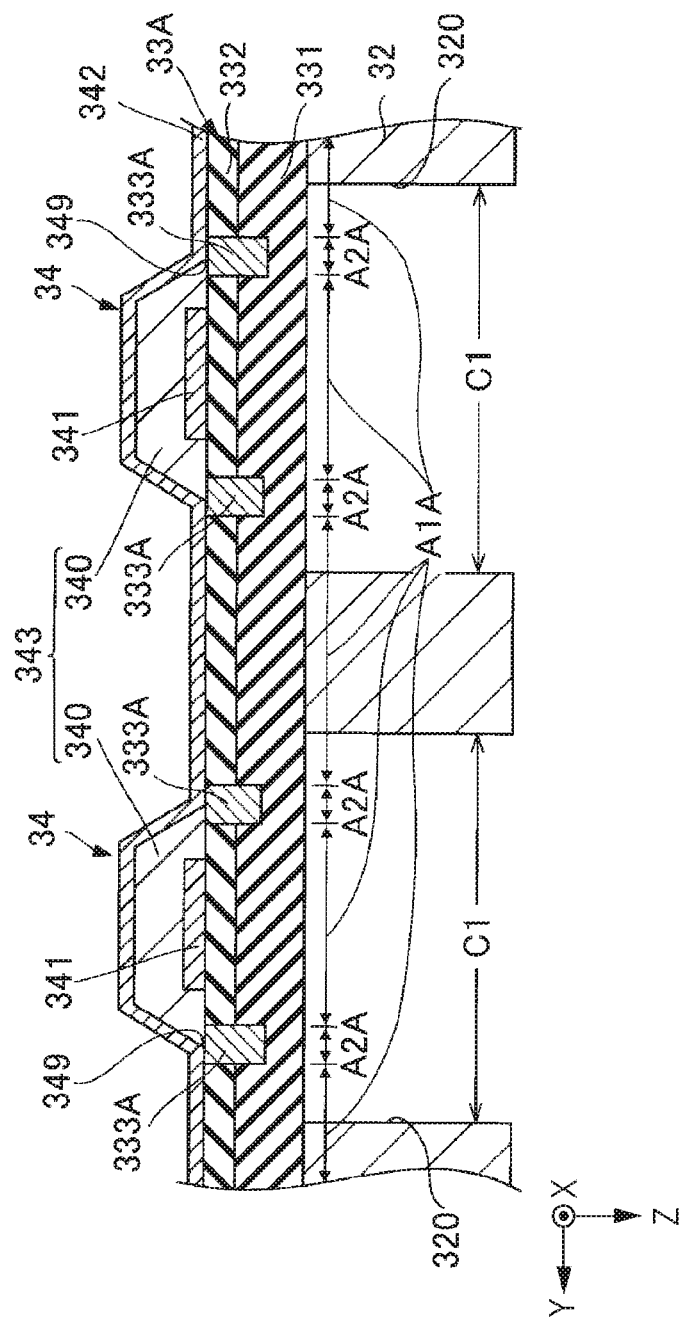
FIG. 11 is an enlarged sectional view of a portion of a vibration plate in a second embodiment.
Figure 12:
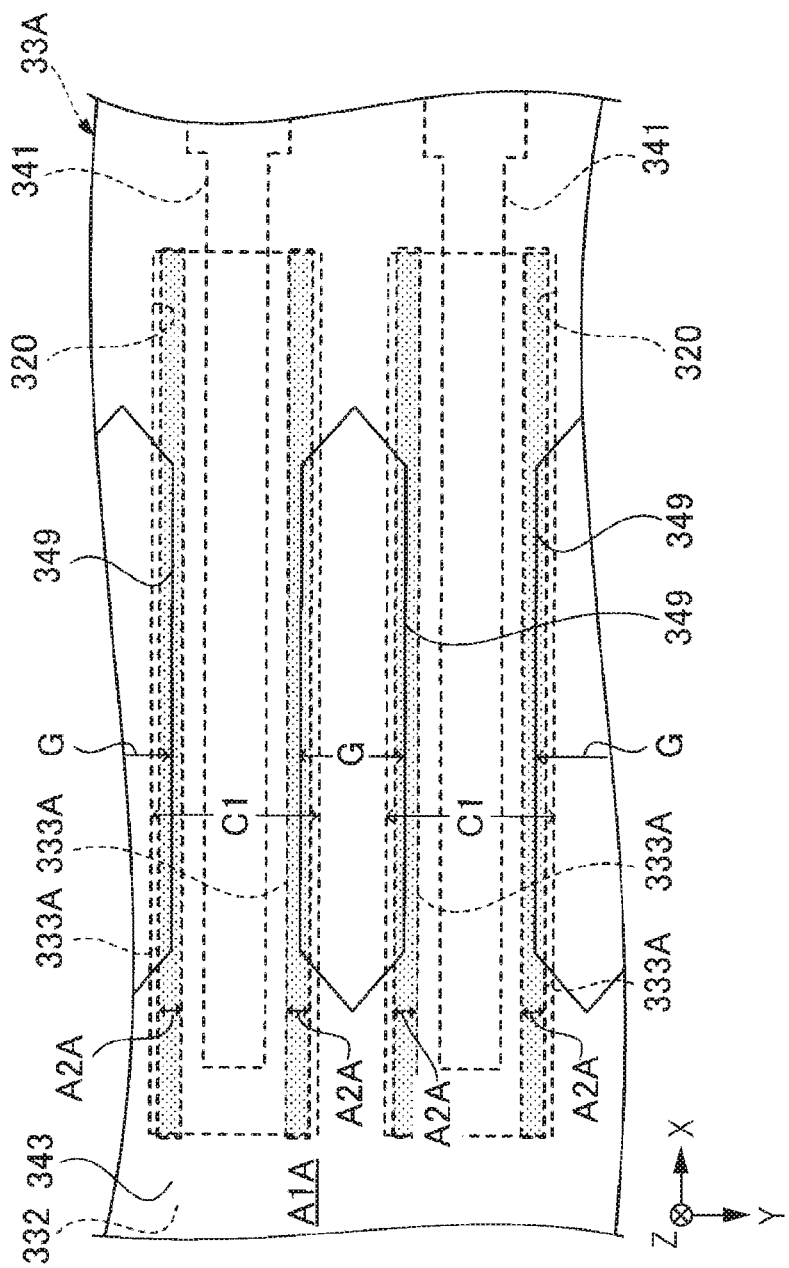
FIG. 12 is an enlarged plan view of a portion of the vibration plate and a piezoelectric body in the second embodiment.

FIG. 11 is an enlarged sectional view of a portion of a vibration plate 33A in the second embodiment. FIG. 12 is an enlarged plan view of a portion of the vibration plate 33A in the second embodiment. In FIG. 12, illustration of the second electrode 342 is omitted. In FIG. 12, dots are attached to a second area A2A for convenience.

As illustrated in FIGS. 11 and 12, the vibration plate 33A is divided into a first area A1A and the second area A2A. The second area A2A overlaps the end 349 of the piezoelectric element 34 but does not overlap the wall surface 320 of the pressure chamber substrate 32, in plan view in a direction along the Y-axis. The second area A2A has a longitudinal shape along the end 349, but may have a frame shape, for example. Further, the first area A1A is an area excluding the second area A2A, and surrounds the second area A2A in plan view. The first layer 331 and the second layer 332 are provided in the first area A1A. The first layer 331 and a third layer 333A are provided in the second area A2A. It can be also said that the second area A2A is an area in which the third layer 333A is provided.

As illustrated in FIG. 11, the third layer 333A overlaps the end 349 of the piezoelectric element 34 but does not overlap the wall surface 320 of the pressure chamber substrate 32 in plan view. The third layer 333A is in contact with the end 349 of the piezoelectric element 34. The boundary between the portion of the vibration plate 33A that is in contact with the piezoelectric body 343 and the portion that is not in contact with the piezoelectric body 343 is a starting point in which tensile stress is particularly concentrated when the piezoelectric element 34 is driven and breakage is likely to occur. Accordingly, the third layer 333A is disposed in contact with the end 349 of the piezoelectric element 34, so that an occurrence of a crack in the vibration plate 33A can be effectively suppressed.

3. Third Embodiment

A third embodiment will be described. In each of the following examples, the elements having the same functions as those of the first embodiment will be denoted by the same reference numerals used in the description of the first embodiment, and detailed description thereof will be omitted as appropriate.

Figure 13:
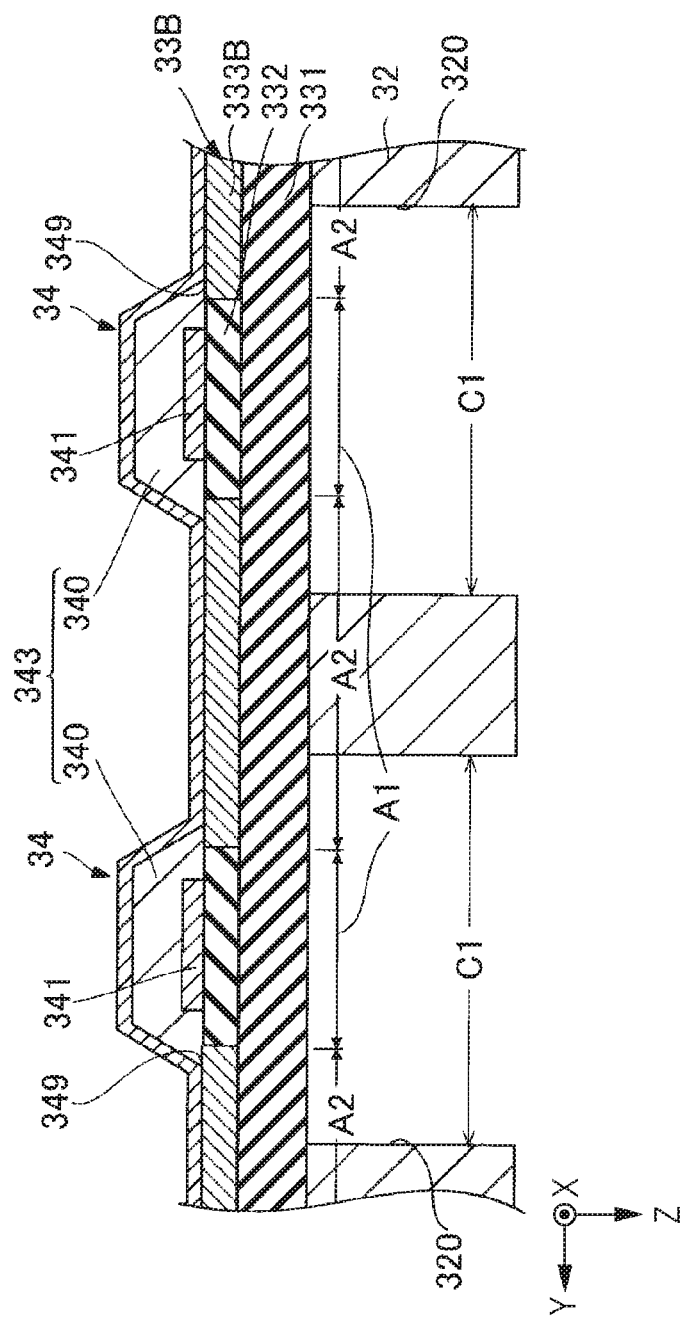
FIG. 13 is an enlarged sectional view of a portion of a vibration plate in a third embodiment.

FIG. 13 is an enlarged sectional view of a portion of a vibration plate 33B and the piezoelectric body 343 in the third embodiment. As illustrated in FIG. 13, a third layer 333B of the vibration plate 33B is disposed to penetrate the second layer 332, and is in contact with the upper surface of the first layer 331. Provision of the third layer 333B can also effectively suppress an occurrence of a crack in the vibration plate 33B.

The provision of the third layer 333B in the present embodiment is particularly effective when the adhesion between a material constituting the third layer 333B and a material constituting the second layer 332 is larger than the adhesion between the material constituting the third layer 333B and a material constituting the first layer 331, and an etching rate of the second layer 332 is much higher than an etching rate of the first layer 331.

Figure 14:
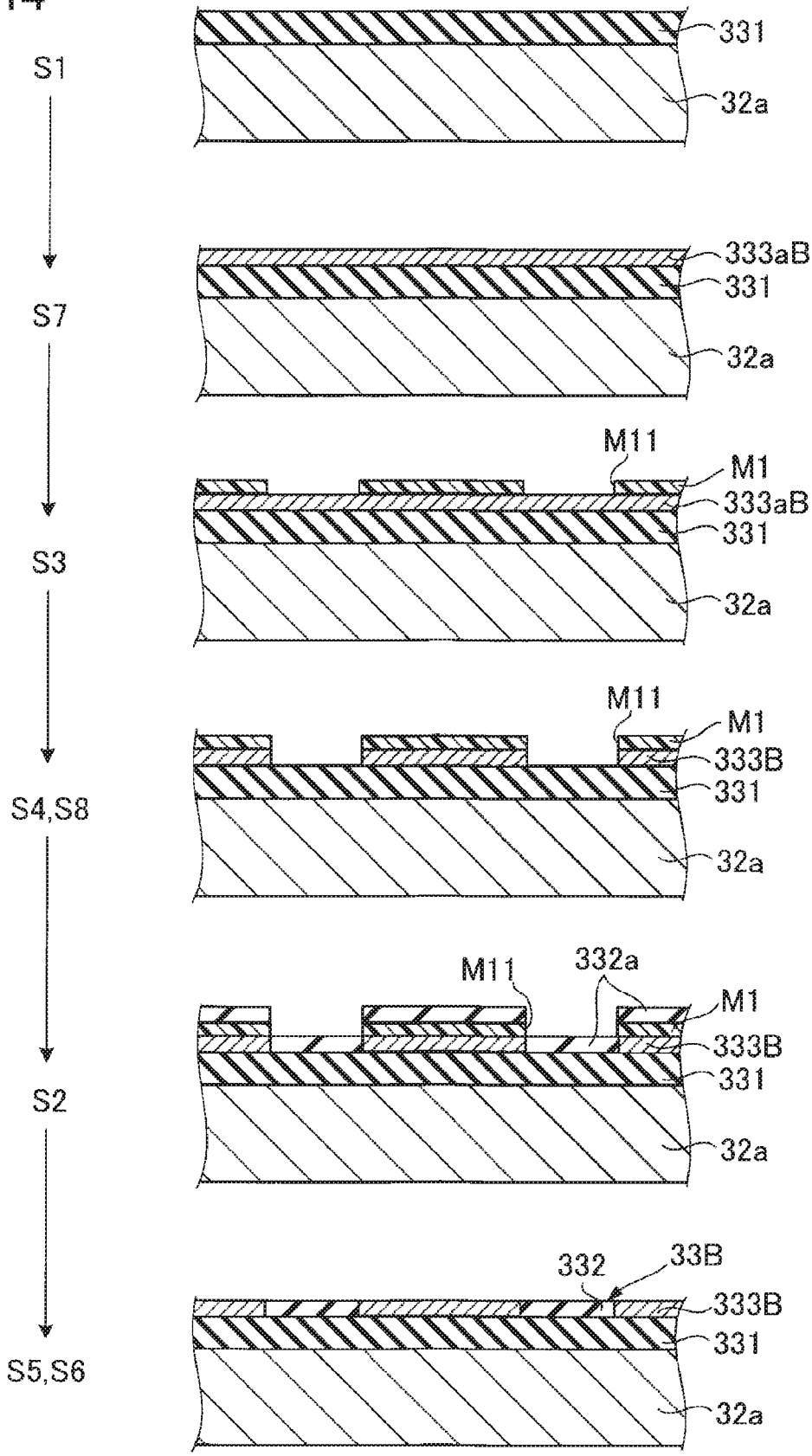
FIG. 14 is a sectional view illustrating manufacturing steps of the vibration plate according to the third embodiment.

FIG. 14 is a sectional view illustrating manufacturing steps of the vibration plate 33B according to the third embodiment. As illustrated in FIG. 14, the elastic film forming step S7 is performed after the first layer forming step S1. In the elastic film forming step S7 in the present embodiment, an elastic film 333aB containing various metals or the like, for example, is formed on the upper surface of the first layer 331.

After the elastic film forming step S7, the mask forming step S3 is performed. In the mask forming step S3 in the present embodiment, the mask M1 that is a resist film is formed on an upper surface of the elastic film 333aB. After the mask forming step S3, the etching step S4 and the third layer forming step S8 are performed. In the etching step S4 in the present embodiment, a portion of the elastic film 333aB is removed by etching or the like using the mask M1. By removing the portion of the elastic film 333aB, the third layer 333B is obtained. That is, the third layer forming step S8 is performed.

After the third layer forming step S8, the insulating film forming step S2 is performed. In the insulating film forming step S2 in the present embodiment, the insulating film 332a, which is a zirconium-containing layer containing zirconium, for example, is stacked on the upper surface of the third layer 333B and the upper surface of the mask M1.

After the insulating film forming step S2, the mask removing step S5 is performed. In the mask removing step S5 in the present embodiment, a portion of the insulating film 332a that overlaps the mask M1 in plan view is removed along with the removal of the mask M1 by lift-off. However, the removal of the mask M1 and the removal of a portion of the insulating film 332a may be performed by polishing such as CMP. After the mask removing step S5, the second layer forming step S6 is performed. In the second layer forming step S6 in the present embodiment, the second layer 332 containing zirconium oxide is formed by thermally oxidizing the insulating film 332a.

According to the above method, the vibration plate 33B having the first layer 331, the second layer 332, and the third layer 333B can be formed reliably and easily.

4. Fourth Embodiment

A fourth embodiment will be described. In each of the following examples, the elements having the same functions as those of the third embodiment will be denoted by the same reference numerals used in the description of the third embodiment, and detailed description thereof will be omitted as appropriate.

Figure 15:
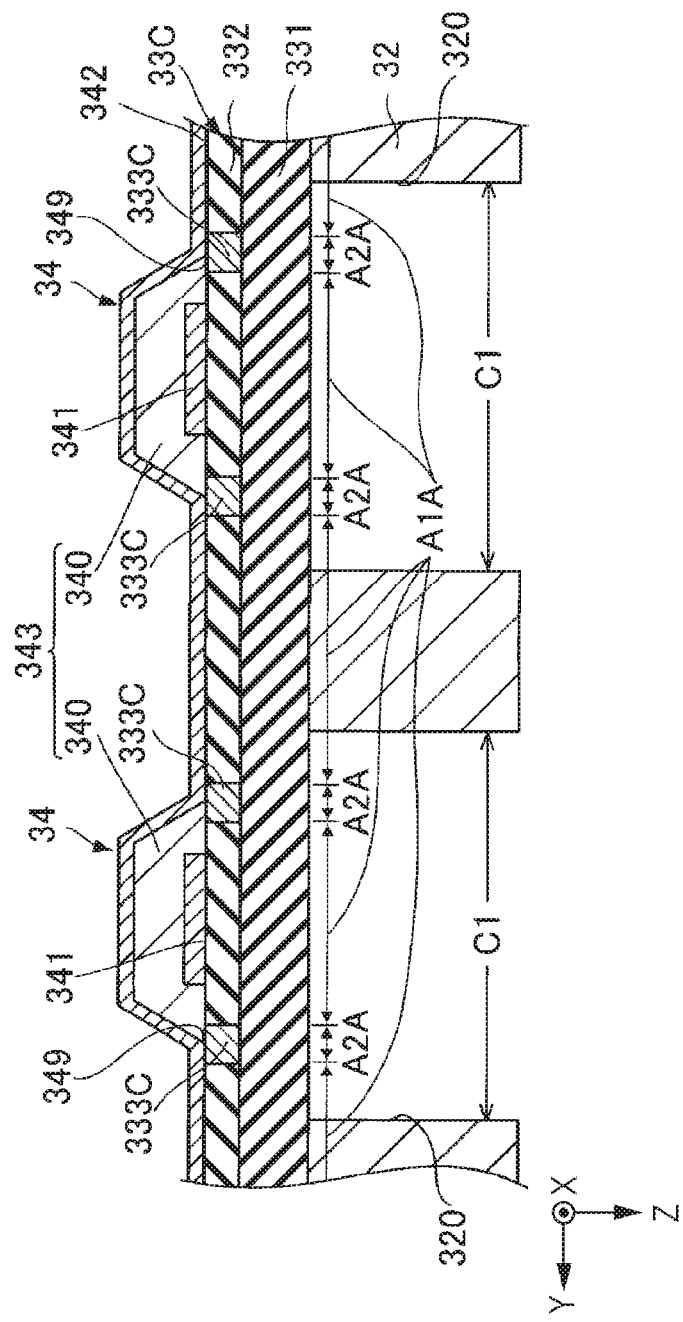
FIG. 15 is an enlarged sectional view of a portion of a vibration plate according to a fourth embodiment.

FIG. 15 is an enlarged sectional view of a portion of a vibration plate 33C in the fourth embodiment. As illustrated in FIG. 15, the vibration plate 33C is divided into the first area A1A and the second area A2A in a direction along the Y-axis, similarly to the vibration plate 33A in the second embodiment. In the present embodiment, the first layer 331 and a third layer 333C are provided in the second area A2A. It can be also said that the second area A2A in the present embodiment is an area in which the third layer 333C is provided.

The third layer 333C overlaps the end 349 of the piezoelectric element 34 but does not overlap the wall surface 320 in plan view. The third layer 333C is in contact with the end 349 of the piezoelectric element 34. The boundary between the portion of the vibration plate 33C that is in contact with the piezoelectric body 343 and the portion that is not in contact with the piezoelectric body 343 is a starting point in which tensile stress is particularly concentrated when the piezoelectric element 34 is driven and breakage is likely to occur. Accordingly, the third layer 333C is disposed in contact with the end 349 of the piezoelectric element 34, so that an occurrence of a crack in the vibration plate 33C can be effectively suppressed.

5. Fifth Embodiment

A fifth embodiment will be described. In each of the following examples, the elements having the same functions as those of the first embodiment will be denoted by the same reference numerals used in the description of the first embodiment, and detailed description thereof will be omitted as appropriate.

Figure 16:
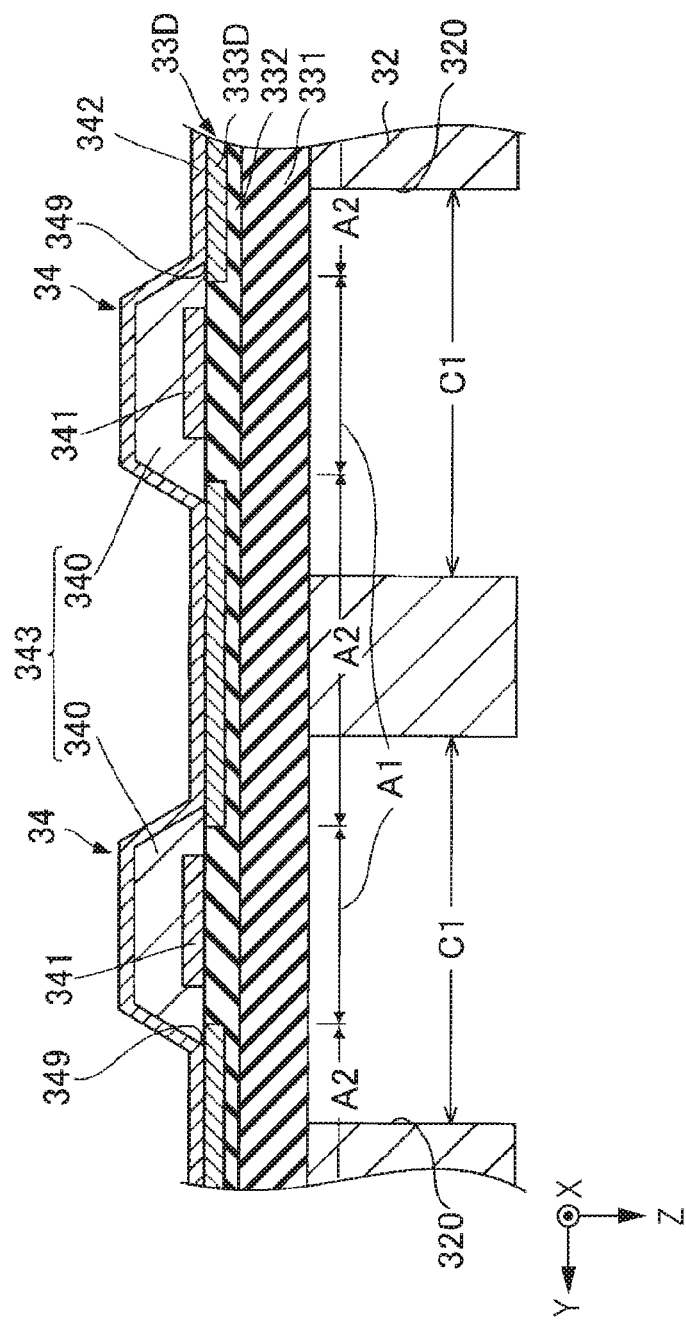
FIG. 16 is an enlarged sectional view of a portion of a vibration plate according to a fifth embodiment.

FIG. 16 is an enlarged sectional view of a portion of a vibration plate 33D in the fifth embodiment. As illustrated in FIG. 16, the third layer 333D included in the vibration plate 33D is disposed from the upper surface of the second layer 332 to a midway of the second layer 332 in a thickness direction. The third layer 333D is not in contact with the first layer 331. Such provision of the third layer 333D can also effectively suppress an occurrence of a crack in the vibration plate 33D.

The provision of the third layer 333D in the present embodiment is especially effective when the adhesion between a material constituting the third layer 333D and a material constituting the first layer 331 is smaller than the adhesion between the material constituting the third layer 333D and a material constituting the second layer 332.

Figure 17:
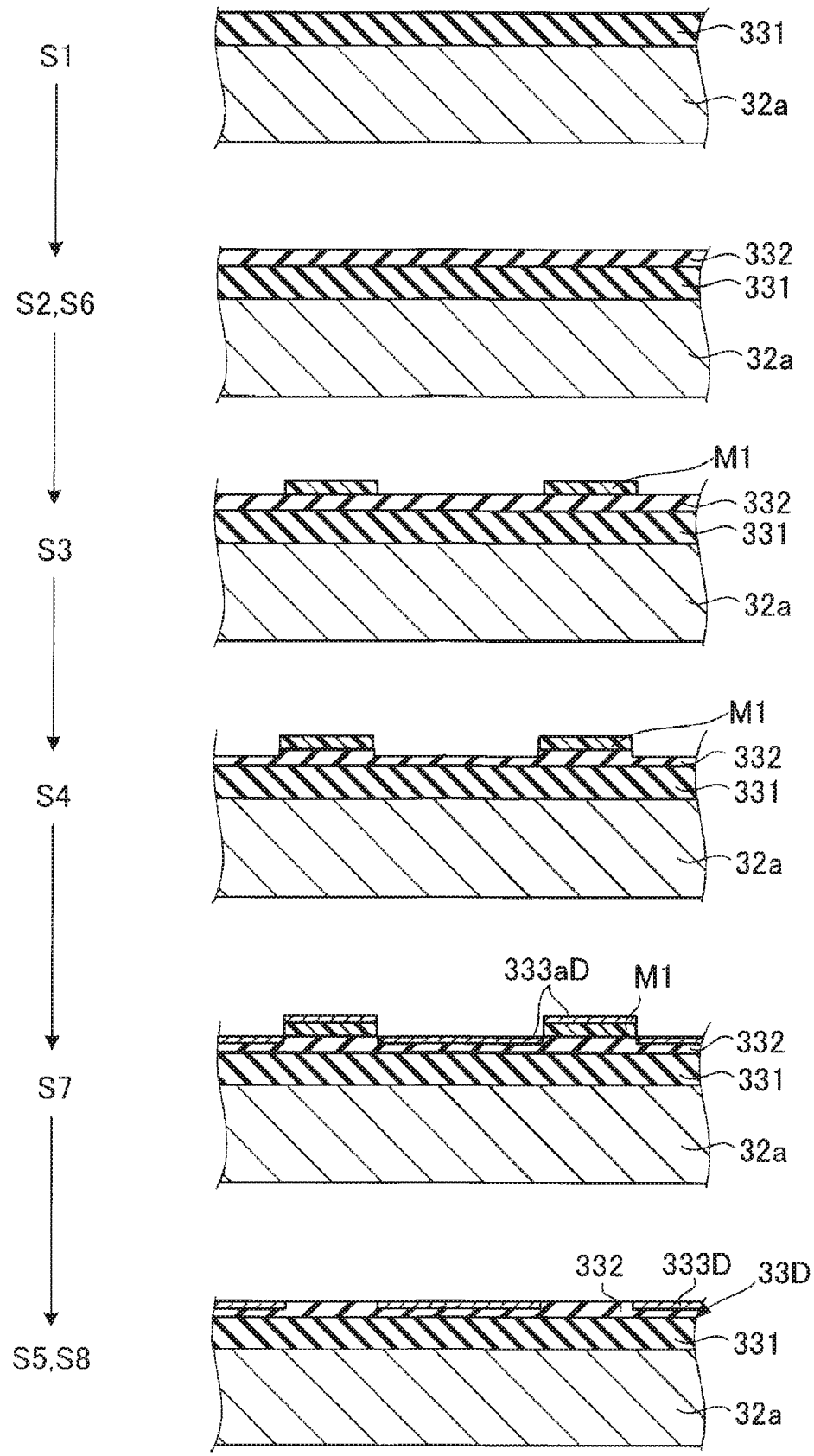
FIG. 17 is a sectional view illustrating manufacturing steps of the vibration plate in the fifth embodiment.

FIG. 17 is a sectional view illustrating manufacturing steps of the vibration plate 33D according to the fifth embodiment. As illustrated in FIG. 17, after the first layer forming step S1, the insulating film forming step S2 and the second layer forming step S6 are performed. That is, the second layer 332 containing zirconium oxide is formed by stacking a zirconium-containing layer on the first layer 331 and thermally oxidizing the layer.

After the second layer forming step S6, the mask forming step S3 and the etching step S4 are performed in this order. After the etching step S4, the elastic film forming step S7 is performed. In the elastic film forming step S7 in the present embodiment, an elastic film 333aD containing various metals or the like, for example, is stacked on the upper surface of the mask M1 and the upper surface of the second layer 332.

After the elastic film forming step S7, the mask removing step S5 and the third layer forming step S8 are performed. In the mask removing step S5 in the present embodiment, a portion of the elastic film 333aD that overlaps the mask M1 in plan view is removed along with the removal of the mask M1 by lift-off. The removal of the mask M1 and the removal of a portion of the elastic film 333aD may be performed by polishing such as CMP. By removing a portion of the elastic film 333aD, the third layer 333D is formed by the remaining portion of the elastic film 333aD. That is, the third layer forming step S8 is performed.

According to the above method, the vibration plate 33D having the first layer 331, the second layer 332, and the third layer 333D can be formed reliably and easily.

6. Sixth Embodiment

A sixth embodiment will be described. In each of the following examples, the elements having the same functions as those of the fifth embodiment will be denoted by the same reference numerals used in the description of the fifth embodiment, and detailed description thereof will be omitted as appropriate.

Figure 18:
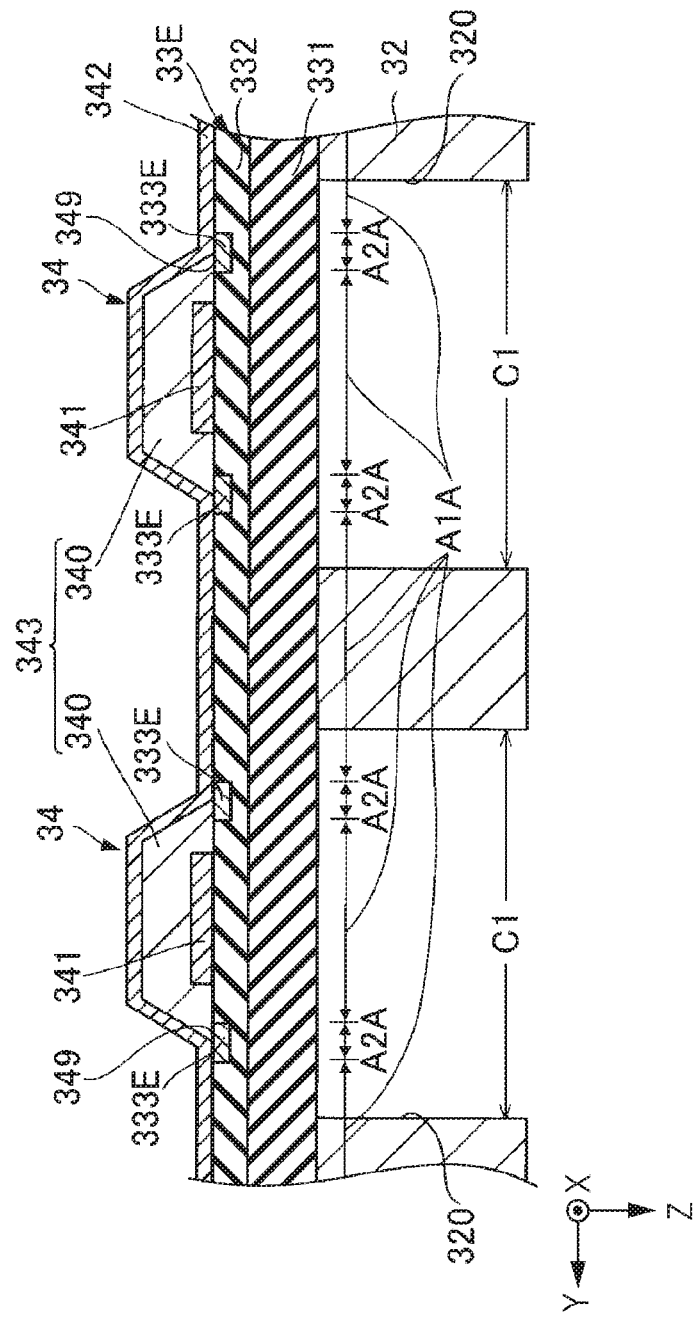
FIG. 18 is an enlarged sectional view of a portion of a vibration plate according to a sixth embodiment.

FIG. 18 is an enlarged sectional view of a portion of a vibration plate 33E in the sixth embodiment. As illustrated in FIG. 18, the vibration plate 33E is divided into the first area A1A and the second area A2A, similarly to the vibration plate 33A in the second embodiment. In the present embodiment, the first layer 331 and the third layer 333E are provided in the second area A2A. It can be also said that the second area A2A in the present embodiment is an area in which the third layer 333E is provided.

The third layer 333E overlaps the end 349 of the piezoelectric element 34 but does not overlap the wall surface 320 in a direction along the Y-axis in plan view. The third layer 333E is in contact with the end 349 of the piezoelectric element 34. The boundary between the portion of the vibration plate 33E that is in contact with the piezoelectric body 343 and the portion that is not in contact with the piezoelectric body 343 is a starting point in which tensile stress is particularly concentrated when the piezoelectric element 34 is driven and breakage is likely to occur. Accordingly, the third layer 333E is disposed in contact with the end 349 of the piezoelectric element 34, so that an occurrence of a crack in the vibration plate 33E can be effectively suppressed.

7. Seventh Embodiment

A seventh embodiment will be described. In each of the following examples, the elements having the same functions as those of the first embodiment will be denoted by the same reference numerals used in the description of the first embodiment, and detailed description thereof will be omitted as appropriate.

Figure 19:
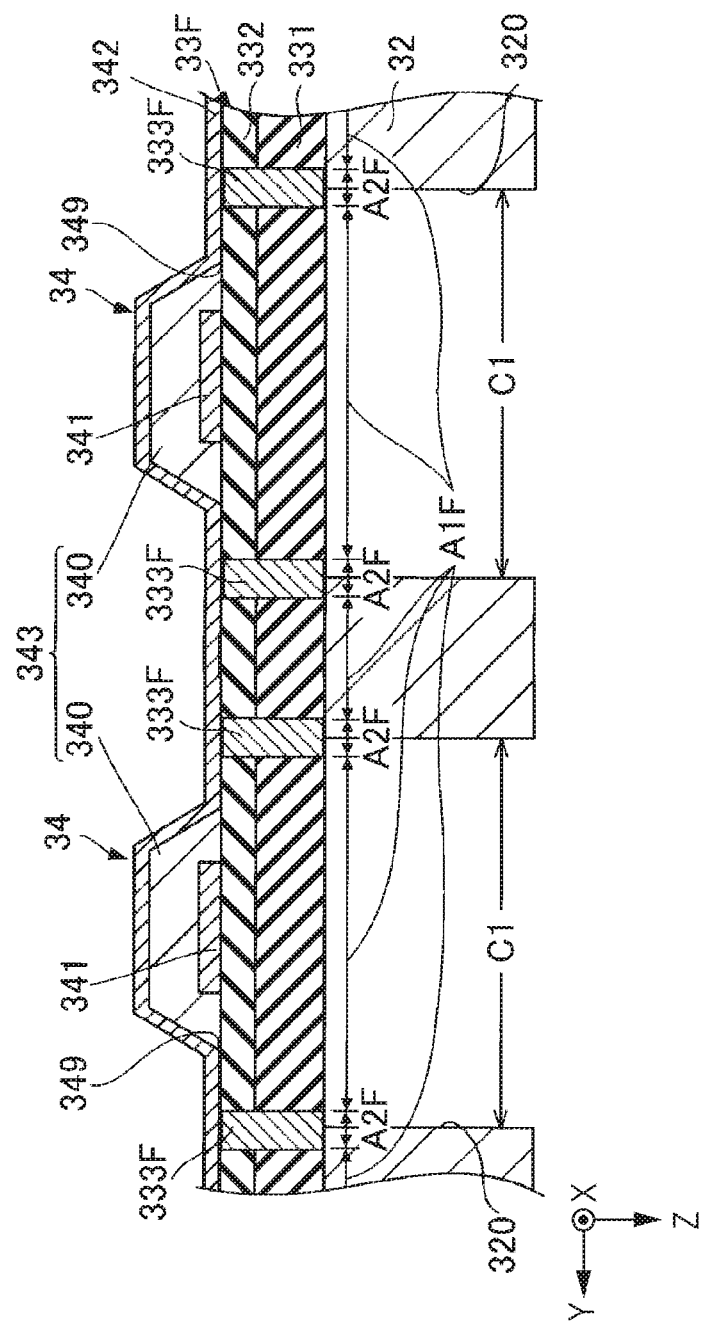
FIG. 19 is an enlarged sectional view of a portion of a vibration plate according to a seventh embodiment.
Figure 20:
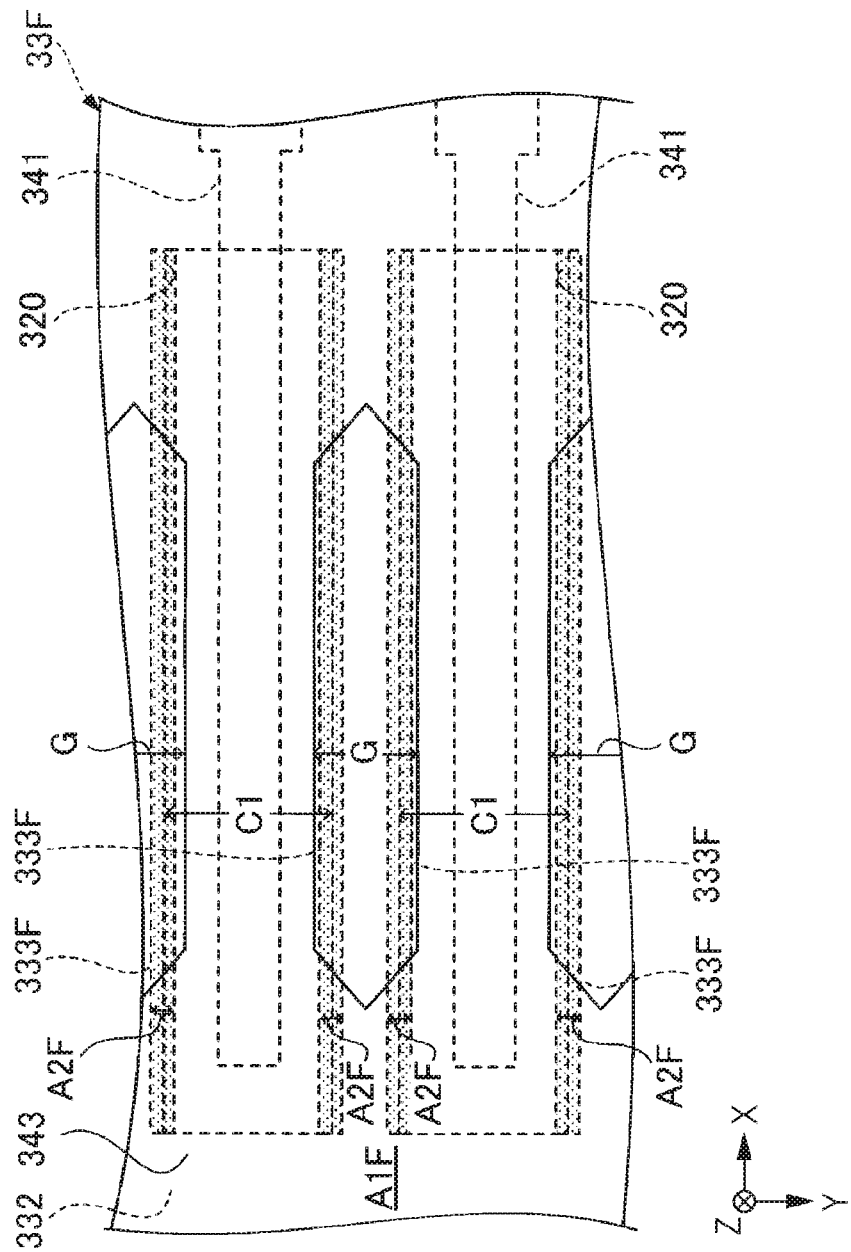
FIG. 20 is an enlarged plan view of a portion of the vibration plate and a piezoelectric body in the seventh embodiment.

FIG. 19 is an enlarged sectional view of a portion of a vibration plate 33F in the seventh embodiment. FIG. 20 is an enlarged plan view of a portion of the vibration plate 33F and the piezoelectric body 343 in the seventh embodiment. In FIG. 20, illustration of the second electrode 342 is omitted. In FIG. 20, dots are attached to a second area A2F for convenience.

As illustrated in FIGS. 19 and 20, the vibration plate 33F is divided into a first area A1F and a second area A2F. The second area A2F overlaps the wall surface 320 of the pressure chamber substrate 32 but does not overlap the end 349 of the piezoelectric element 34 in plan view in a direction along the Y-axis. The second area A2F has a longitudinal shape along the end 349, but may have a frame shape, for example. Further, the first area A1F is an area excluding the second area A2F and surrounds the second area A2F in plan view, but the second area A2F does not have to be surrounded and, for example, is extended over the entire area of the vibration plate 33F in the X direction (the first area A1F does not exist even at an end portion in the X direction). The first layer 331 and the second layer 332 are provided in the first area A1F. The first layer 331 and a third layer 333F are provided in the second area A2F. It can be also said that the second area A2F is an area in which the third layer 333F is provided.

As illustrated in FIG. 19, the third layer 333F overlaps the end 349 of the piezoelectric element 34 but does not overlap the wall surface 320 of the pressure chamber substrate 32 in plan view in a direction along the Y-axis. The third layer 333F penetrates the second layer 332 and the first layer 331. The third layer 333F is in contact with the pressure chamber substrate 32 and the second electrode 342. The boundary between the portion of the vibration plate 33F that is in contact with the pressure chamber substrate 32 and the portion that is not in contact with the pressure chamber substrate 32 is a starting point in which tensile stress is particularly concentrated when the piezoelectric element 34 is driven and breakage is likely to occur. Accordingly, the third layer 333F is in contact with the pressure chamber substrate 32 and overlaps the wall surface 320 in plan view, so that an occurrence of a crack in the vibration plate 33F can be effectively suppressed. Further, the third layer 333F is in contact with the second electrode 342, so that a voltage drop of a reference voltage can be reduced.

Further, the third layer 333F is formed from a ductile material, so that the resistance of the third layer 333F to tensile stress increases, and the time until a crack occurs in the vibration plate 33F increases. Accordingly, the third layer 333F overlaps the wall surface 320 of the pressure chamber substrate 32 in plan view and is in contact with the pressure chamber substrate 32, so that the occurrence of a crack in the vibration plate 33F can be particularly effectively suppressed.

Figure 21:
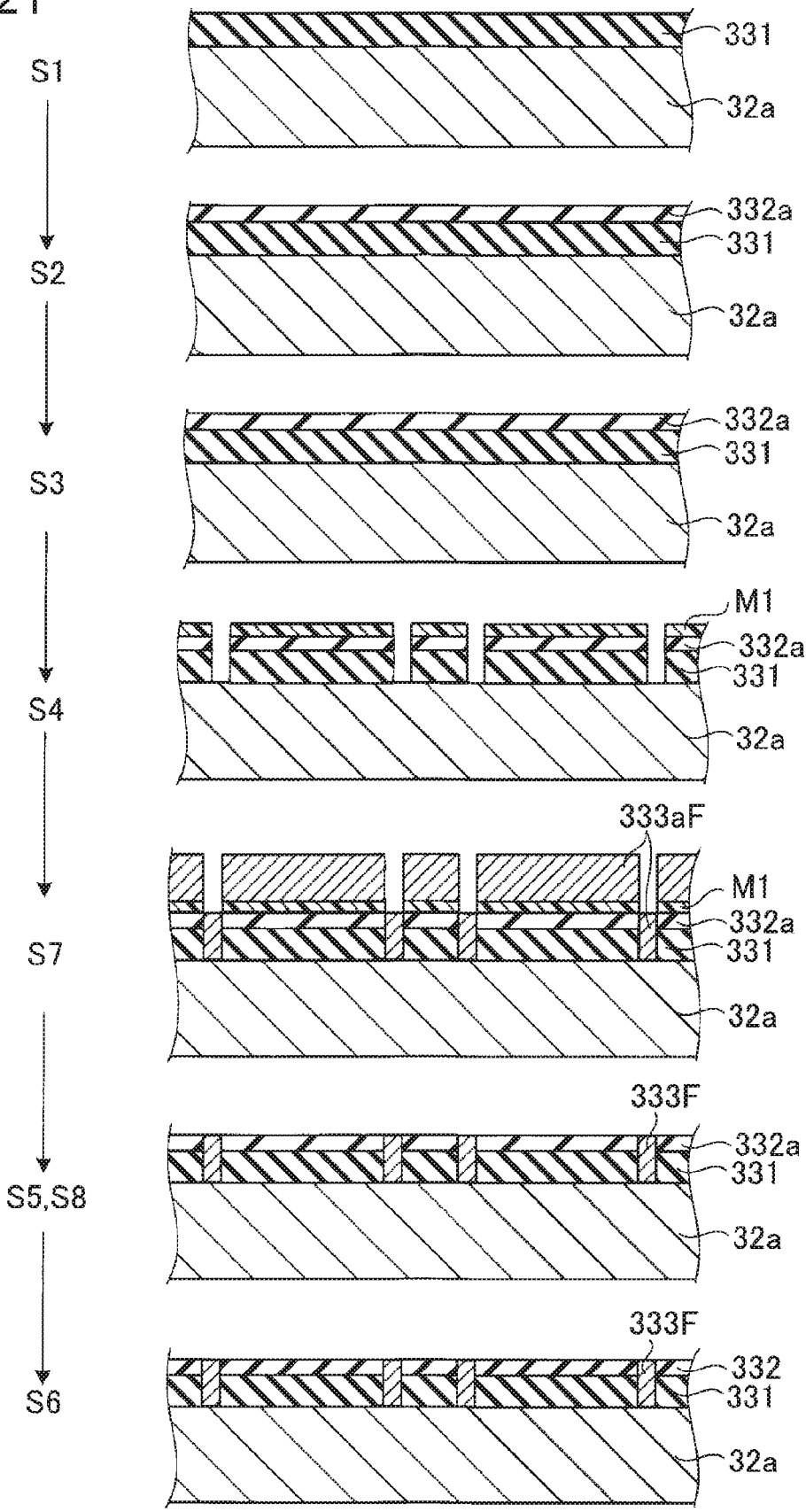
FIG. 21 is a sectional view illustrating manufacturing steps of the vibration plate in the seventh embodiment.

FIG. 21 is a sectional view illustrating manufacturing steps of the vibration plate 33F according to the seventh embodiment. As illustrated in FIG. 21, the first layer forming step S1, the insulating film forming step S2, the mask forming step S3, and the etching step S4 are performed in this order. After the etching step S4, the elastic film forming step S7 is performed. In the elastic film forming step S7 in the present embodiment, an elastic film 333aF containing various metals or the like, for example, is stacked on the upper surface of the mask M1 and the upper surface of the substrate 32a.

After the elastic film forming step S7, the mask removing step S5 and the third layer forming step S8 are performed. In the mask removing step S5 in the present embodiment, a portion of the elastic film 333aF that overlaps the mask M1 in plan view is removed along with the removal of the mask M1 by lift-off. The removal of the mask M1 and the removal of a portion of the elastic film 333aF may be performed by polishing such as CMP. By removing a portion of the elastic film 333aF, the third layer 333F is formed by the remaining portion of the elastic film 333aF. That is, the third layer forming step S8 is performed.

After the third layer forming step S8, the second layer forming step S6 is performed. In the second layer forming step S6 in the present embodiment, the second layer 332 containing zirconium oxide is formed by thermally oxidizing the insulating film 332a exposed by removing the mask M1.

Figure 22:
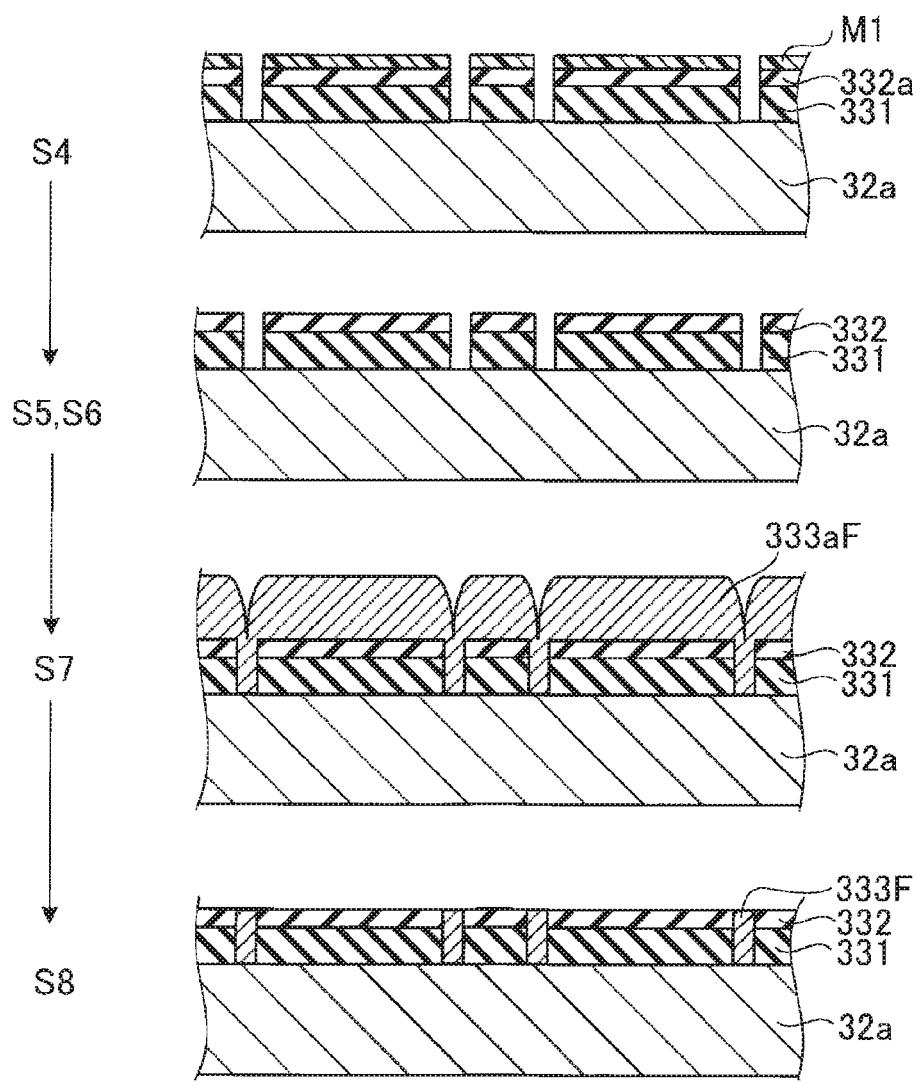
FIG. 22 is a sectional view illustrating another example of manufacturing steps of the vibration plate in the seventh embodiment.

FIG. 22 is a sectional view illustrating another example of the manufacturing step of the vibration plate 33F according to the seventh embodiment. As illustrated in FIG. 22, as in the first embodiment, after the etching step S4, the mask removing step S5, the second layer forming step S6, the elastic film forming step S7, and the third layer forming step S8 may be performed in this order.

According to the manufacturing methods illustrated in FIG. 21 or FIG. 22, the vibration plate 33F having the first layer 331, the second layer 332, and the third layer 333F can be formed reliably and easily.

8. Eighth Embodiment

An eighth embodiment will be described. In each of the following examples, the elements having the same functions as those of the seventh embodiment will be denoted by the same reference numerals used in the description of the seventh embodiment, and detailed description thereof will be omitted as appropriate.

Figure 23:
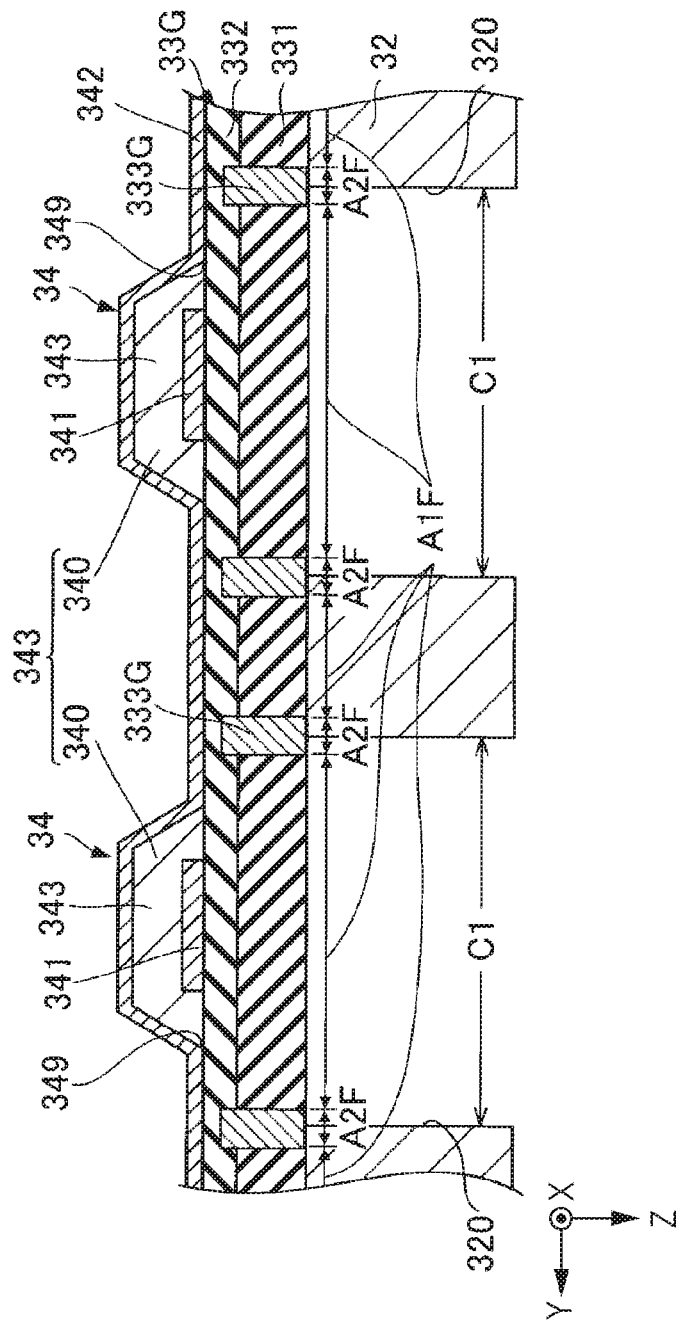
FIG. 23 is an enlarged sectional view of a portion of a vibration plate according to an eighth embodiment.

FIG. 23 is an enlarged sectional view of a portion of a vibration plate 33G in the eighth embodiment. As illustrated in FIG. 23, the third layer 333G is in contact with the pressure chamber substrate 32 but is not in contact with the second electrode 342. The third layer 333G is disposed to penetrate the first layer 331, and is disposed from a lower surface of the second layer 332 to a midway of the second layer 332 in a thickness direction. The third layer 333G is in contact with the pressure chamber substrate 32 and is in contact with the wall surface 320 in plan view, so that an occurrence of a crack in the vibration plate 33G can be effectively suppressed.

The provision of the third layer 333G in the present embodiment is especially effective when the adhesion between a material constituting the third layer 333G and a material constituting the first layer 331 is larger than the adhesion between the material constituting the third layer 333G and a material constituting the second layer 332.

Figure 24:
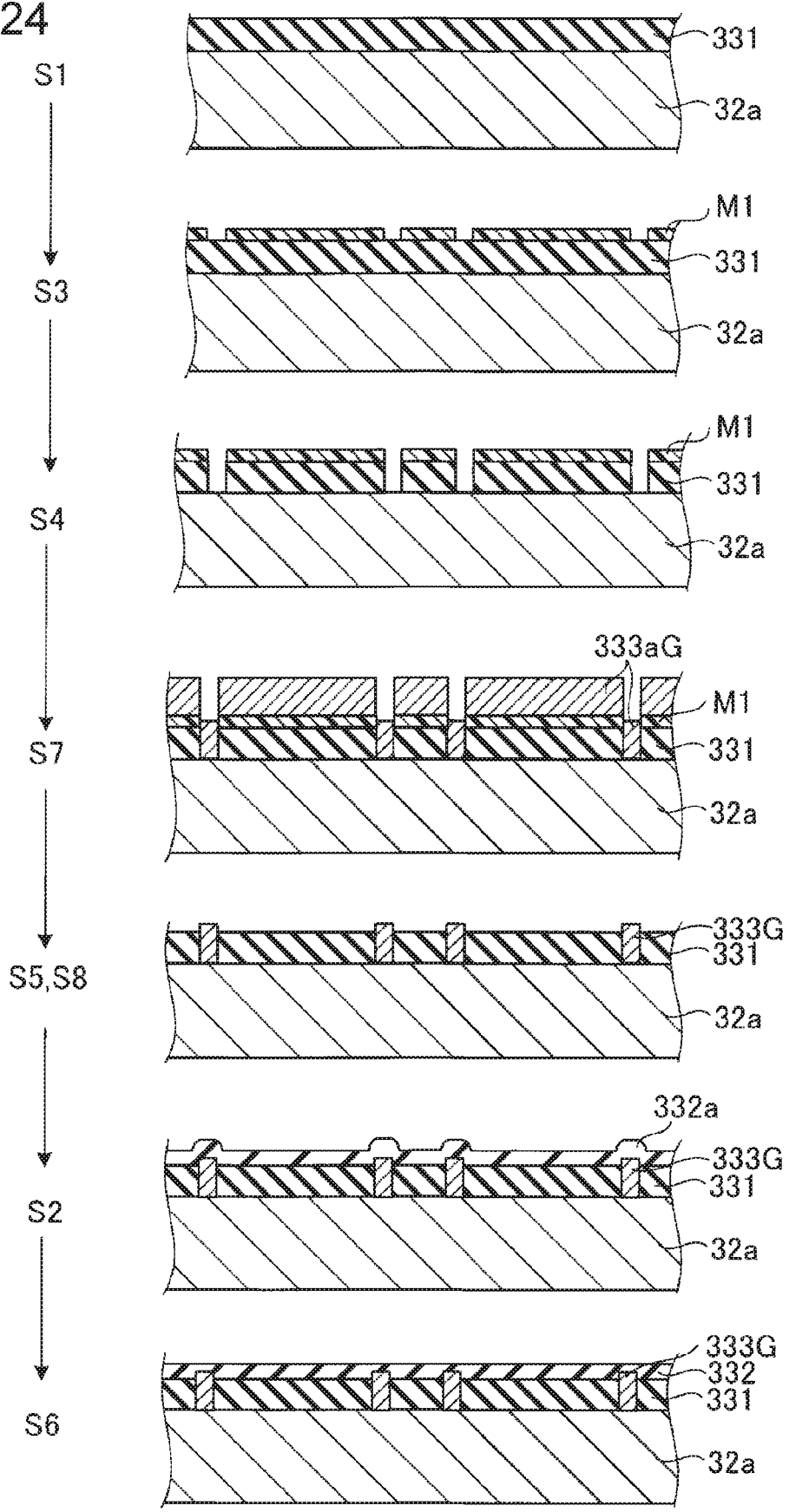
FIG. 24 is a sectional view illustrating manufacturing steps of the vibration plate in the eighth embodiment.

FIG. 24 is a sectional view illustrating manufacturing steps of the vibration plate 33G according to the eighth embodiment. As illustrated in FIG. 24, the mask forming step S3 is performed after the first layer forming step S1. In the mask forming step S3 in the present embodiment, the mask M1 is formed on the upper surface of the first layer 331.

After the mask forming step S3, the etching step S4 is performed. In the etching step S4 in the present embodiment, a portion of the first layer 331 is removed by etching or the like using the mask M1. After the etching step S4, the elastic film forming step S7 is performed. In the elastic film forming step S7 in the present embodiment, an elastic film 333aG containing various metals or the like, for example, is stacked on the upper surface of the mask M1 and the upper surface of the substrate 32a.

After the elastic film forming step S7, the mask removing step S5 and the third layer forming step S8 are performed. In the mask removing step S5 in the present embodiment, a portion of the elastic film 333aG that overlaps the mask M1 in plan view is removed along with the removal of the mask M1 by lift-off. By removing a portion of the elastic film 333aG, the third layer 333G is formed by the remaining portion of the elastic film 333aG. That is, the third layer forming step S8 is performed.

After the third layer forming step S8, the insulating film forming step S2 is performed. In the insulating film forming step S2 in the present embodiment, the insulating film 332a, which is a zirconium-containing layer, for example, is stacked on the upper surface of the first layer 331 and the upper surface of the third layer 333G. After the insulating film forming step S2, the second layer forming step S6 is performed. In the second layer forming step S6 in the present embodiment, the second layer 332 containing zirconium oxide is formed by thermally oxidizing the insulating film 332a.

According to the above method, the vibration plate 33G having the first layer 331, the second layer 332, and the third layer 333G can be formed reliably and easily.

9. Ninth Embodiment

A ninth embodiment will be described. In each of the following examples, the elements having the same functions as those of the seventh embodiment will be denoted by the same reference numerals used in the description of the seventh embodiment, and detailed description thereof will be omitted as appropriate.

Figure 25:
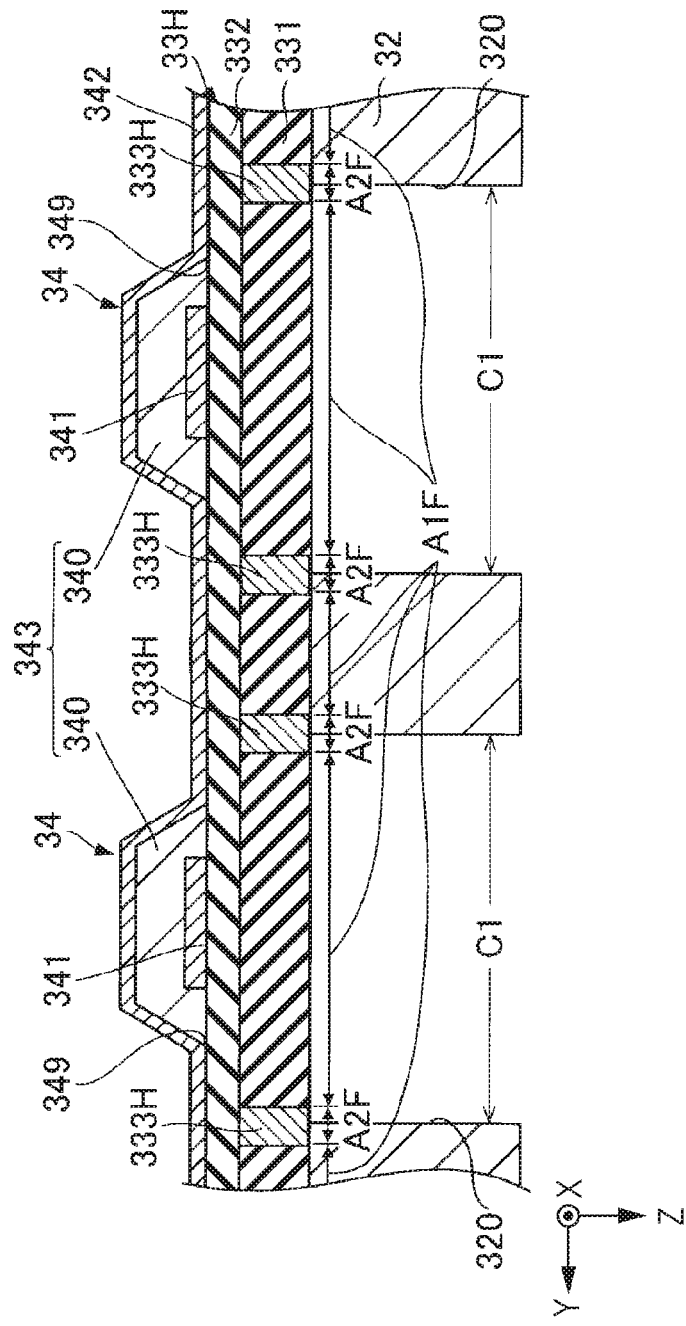
FIG. 25 is an enlarged sectional view of a portion of a vibration plate according to a ninth embodiment.

FIG. 25 is an enlarged sectional view of a portion of a vibration plate 33H according to the ninth embodiment. As illustrated in FIG. 25, the third layer 333H penetrates the first layer 331. An upper surface of the third layer 333H is in contact with the lower surface of the second layer 332. The third layer 333H is in contact with the pressure chamber substrate 32 and is in contact with the wall surface 320 in plan view, so that an occurrence of a crack in the vibration plate 33H can be effectively suppressed.

The provision of the third layer 333H in the present embodiment is especially effective when the adhesion between a material constituting the third layer 333H and a material constituting the first layer 331 is larger than the adhesion between the material constituting the third layer 333H and a material constituting the second layer 332. Further, in the present embodiment, an elastic modulus of a material constituting the third layer 333H may be lower than an elastic modulus of a material constituting the second layer 332, but may be equal to or higher than the elastic modulus of the material constituting the second layer 332. When the elastic modulus of the material constituting the third layer 333H is at least lower than the elastic modulus of the material constituting the first layer 331, the effect of suppressing an occurrence of a crack in the vibration plate 33H can be exhibited.

Figure 26:
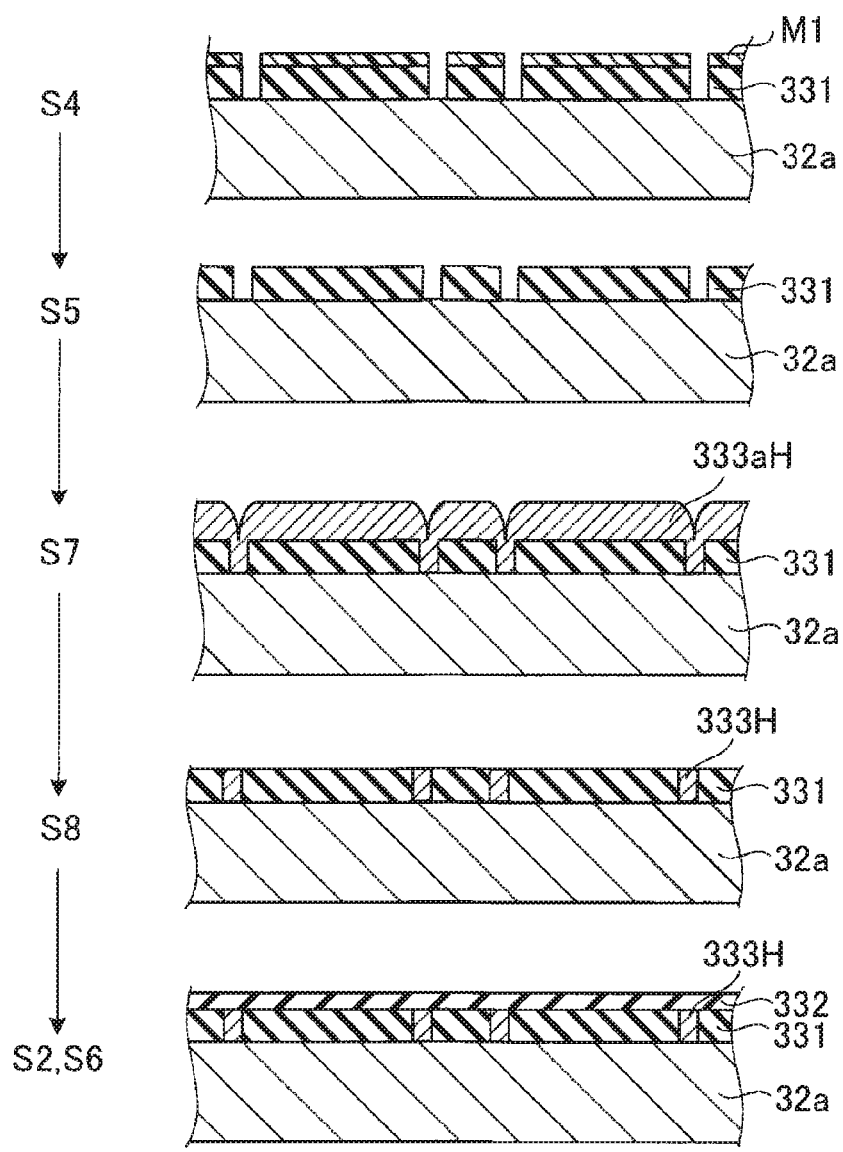
FIG. 26 is a sectional view illustrating manufacturing steps of the vibration plate in the ninth embodiment.

FIG. 26 is a sectional view illustrating manufacturing steps of the vibration plate 33H according to the ninth embodiment. In the manufacturing method according to the present embodiment, similarly to the manufacturing method according to the eighth embodiment, the first layer forming step S1, the mask forming step S3, and the etching step S4 are performed, and as illustrated in FIG. 26, after the etching step S4, the mask removing step S5 is performed. In the mask removing step S5, the first layer 331 is exposed by removing the mask M1.

After the mask removing step S5, the elastic film forming step S7 is performed. In the elastic film forming step S7 in the present embodiment, the elastic film 333aH is formed on the upper surface of the first layer 331 and the upper surface of the substrate 32a. After the elastic film forming step S7, the third layer forming step S8 is performed. By polishing such as CMP, a portion of the elastic film 333aH that overlaps the first layer 331 in plan view is removed. By removing a portion of the elastic film 333aH, the third layer 333H is formed by the remaining portion of the elastic film 333aH. That is, the third layer forming step S8 is performed.

After the third layer forming step S8, the insulating film forming step S2 and the second layer forming step S6 are performed. That is, the second layer 332 containing zirconium oxide is formed by stacking a zirconium-containing layer on the upper surface of the first layer 331 and the upper surface of the third layer 333H and thermally oxidizing the layer.

According to the above method, the vibration plate 33H having the first layer 331, the second layer 332, and the third layer 333H can be formed reliably and easily.

10. Tenth Embodiment

A tenth embodiment will be described. In each of the following examples, the elements having the same functions as those of the seventh embodiment will be denoted by the same reference numerals used in the description of the seventh embodiment, and detailed description thereof will be omitted as appropriate.

Figure 27:
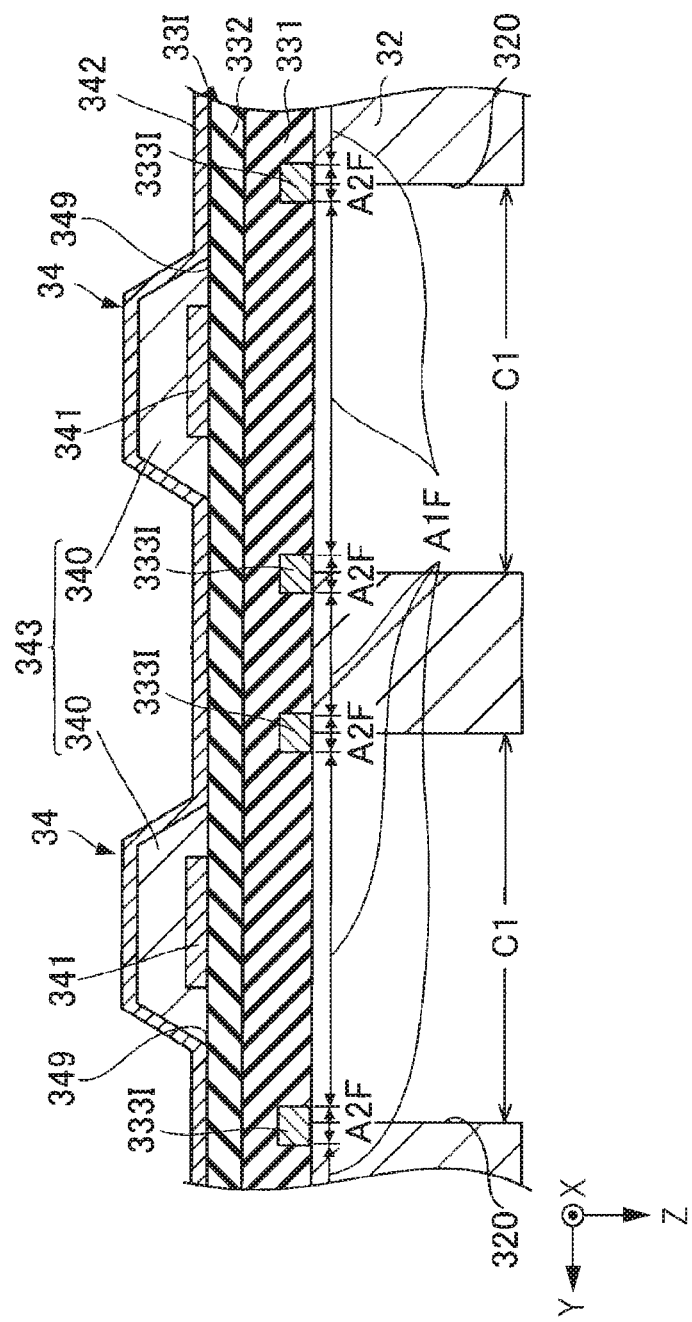
FIG. 27 is an enlarged sectional view of a portion of a vibration plate in a tenth embodiment.

FIG. 27 is an enlarged sectional view of a portion of a vibration plate 33I in the tenth embodiment. As illustrated in FIG. 27, the third layer 333I is disposed from the lower surface of the first layer 331 to a midway of the first layer 331 in a thickness direction. The third layer 333I is not in contact with the second layer 332. The third layer 333I is in contact with the pressure chamber substrate 32 and is in contact with the wall surface 320 in plan view, so that an occurrence of a crack in the vibration plate 33I can be effectively suppressed.

The provision of the third layer 333I in the present embodiment is especially effective when the adhesion between a material constituting the third layer 333I and a material constituting the first layer 331 is larger than the adhesion between the material constituting the third layer 333I and a material constituting the second layer 332. Further, in the present embodiment, an elastic modulus of a material constituting the third layer 333I may be lower than an elastic modulus of a material constituting the second layer 332, but may be equal to or higher than the elastic modulus of the material constituting the second layer 332. When the elastic modulus of the material constituting the third layer 333I is at least lower than the elastic modulus of the material constituting the first layer 331, the effect of suppressing an occurrence of a crack in the vibration plate 33I can be exhibited.

Figure 28:
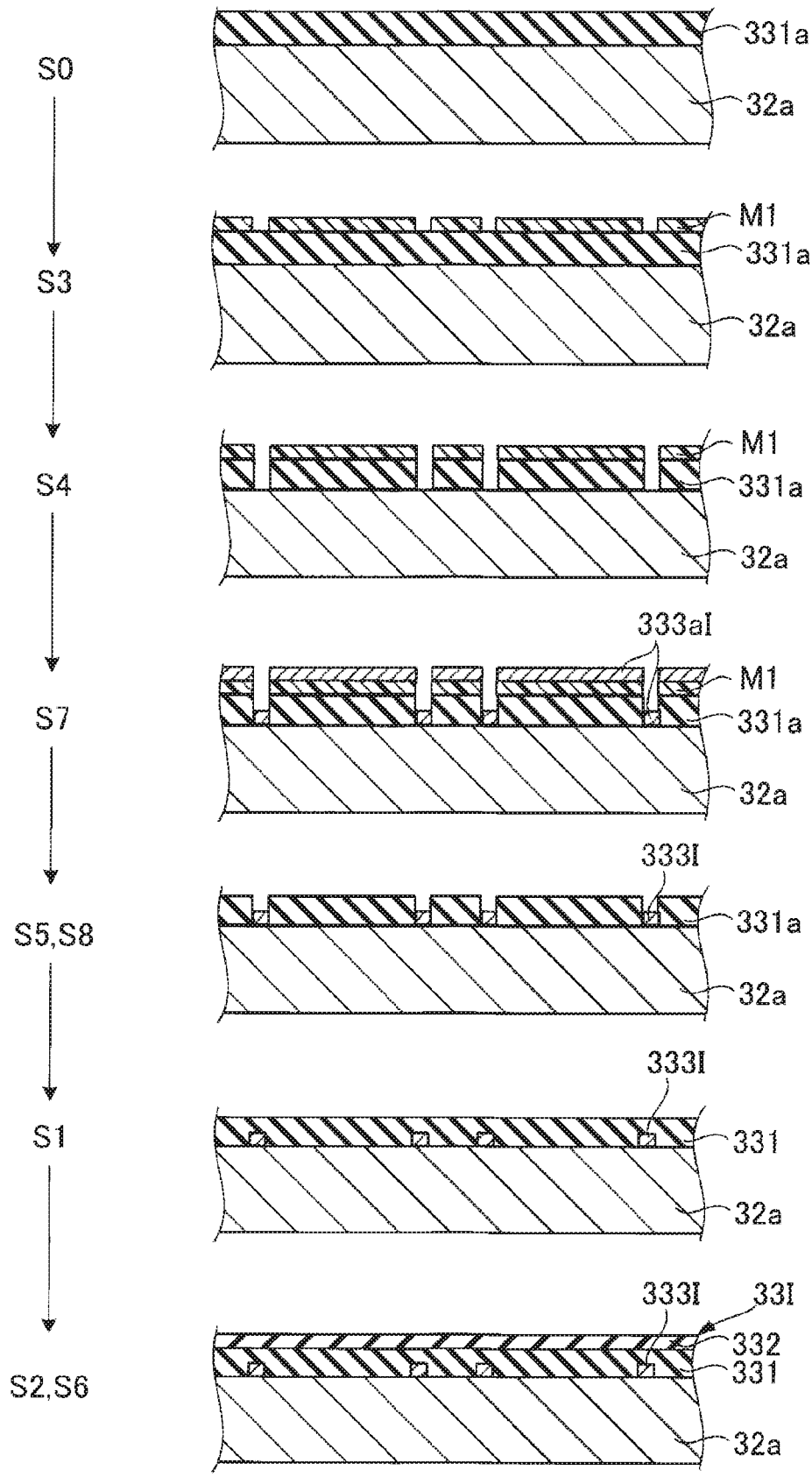
FIG. 28 is a sectional view illustrating manufacturing steps of the vibration plate in the tenth embodiment.

FIG. 28 is a sectional view illustrating manufacturing steps of the vibration plate 33I in the tenth embodiment. As illustrated in FIG. 28, first, for example, a silicon oxide film forming step S0 is performed. In the silicon oxide film forming step S0, a substrate 32a and an oxide film 331a containing silicon oxide are formed by thermally oxidizing an upper surface of a silicon substrate such as a silicon single crystal substrate. The oxide film 331a finally becomes the first layer 331.

After the silicon oxide film forming step S0, the mask forming step S3 is performed. In the mask forming step S3 in the present embodiment, the mask M1 is formed on an upper surface of the oxide film 331a. After the mask forming step S3, the etching step S4 is performed. In the etching step S4 in the present embodiment, a portion of the oxide film 331a is removed by etching or the like using the mask M1.

After the etching step S4, the elastic film forming step S7 is performed. In the elastic film forming step S7 in the present embodiment, an elastic film 333aI containing various metals or the like, for example, is stacked on the upper surface of the mask M1 and the upper surface of the substrate 32a.

After the elastic film forming step S7, the mask removing step S5 and the third layer forming step S8 are performed. In the mask removing step S5 in the present embodiment, a portion of the elastic film 333aI that overlaps the mask M1 in plan view is removed along with the removal of the mask M1 by lift-off. By removing a portion of the elastic film 333aI, the third layer 333I is formed by the remaining portion of the elastic film 333aI. That is, the third layer forming step S8 is performed.

After the third layer forming step S8, the first layer forming step S1 is performed. In the first layer forming step S1, a film containing the same material as the oxide film 331a is stacked to cover the upper surface of the third layer 333I. Then, the first layer 331 is formed by planarizing an upper surface of the film by polishing such as CMP.

After the first layer forming step S1, the insulating film forming step S2 and the second layer forming step S6 are performed. That is, the second layer 332 containing zirconium oxide is formed by stacking a zirconium-containing layer on the first layer 331 and thermally oxidizing the layer.

Figure 29:
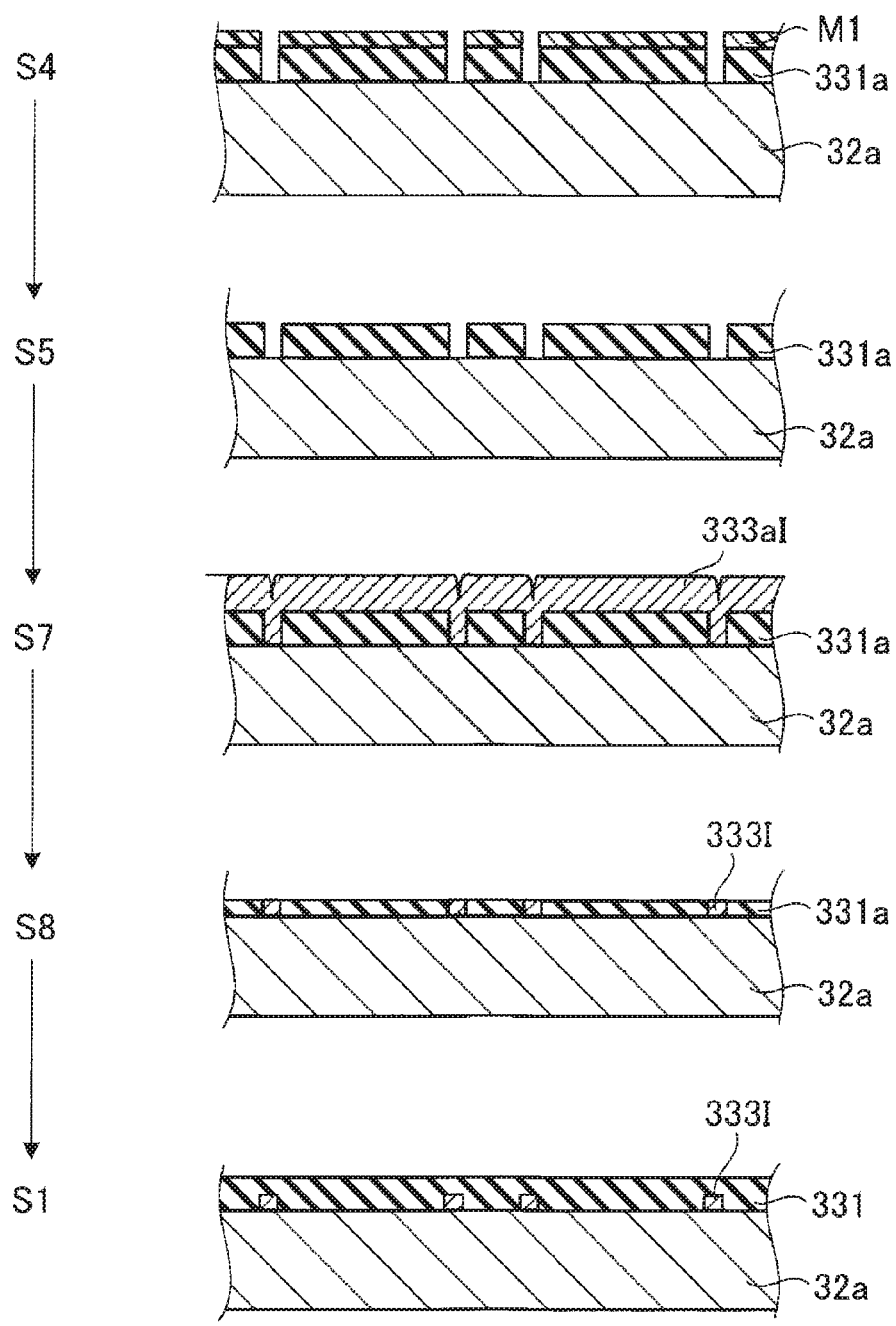
FIG. 29 is a sectional view illustrating another example of manufacturing steps of the vibration plate in the tenth embodiment.

FIG. 29 is a sectional view illustrating another example of the manufacturing step of the vibration plate 33I in the tenth embodiment. As illustrated in FIG. 29, the mask removing step S5 may be performed after the etching step S4 is performed. Similarly to the manufacturing step in FIG. 28, before the etching step S4, the silicon oxide film forming step S0 and the mask forming step S3 are performed in this order.

After the mask removing step S5, the elastic film forming step S7 is performed. In the elastic film forming step S7 in the present embodiment, the elastic film 333aI containing various metals or the like, for example, is stacked on the upper surface of the oxide film 331a exposed by removing the mask M1.

After the elastic film forming step S7, the third layer forming step S8 is performed. In the third layer forming step S8 in the present embodiment, the elastic film 333aI and the first layer 331 are thinned by polishing such as CMP. By making the elastic film 333aI thinner, a portion of the elastic film 333aI and a portion of the oxide film 331a are removed. By removing a portion of the elastic film 333aI, the third layer 333I is formed by the remaining portion of the elastic film 333aI.

After the third layer forming step S8, the first layer forming step S1 is performed. A film containing the same material as the oxide film 331a is stacked to cover an upper surface of the third layer 333I and the upper surface of the oxide film 331a. Then, the first layer 331 is formed by planarizing an upper surface of the film by polishing such as CMP. Similar to the manufacturing step in FIG. 28, after the first layer forming step S1, the insulating film forming step S2 and the second layer forming step S6 are performed.

According to the manufacturing methods illustrated in FIG. 28 or FIG. 29, the vibration plate 33I having the first layer 331, the second layer 332, and the third layer 333I can be formed reliably and easily.

11. Eleventh Embodiment

An eleventh embodiment will be described. In each of the following examples, the elements having the same functions as those of the seventh embodiment will be denoted by the same reference numerals used in the description of the first embodiment, and detailed description thereof will be omitted as appropriate.

Figure 30:
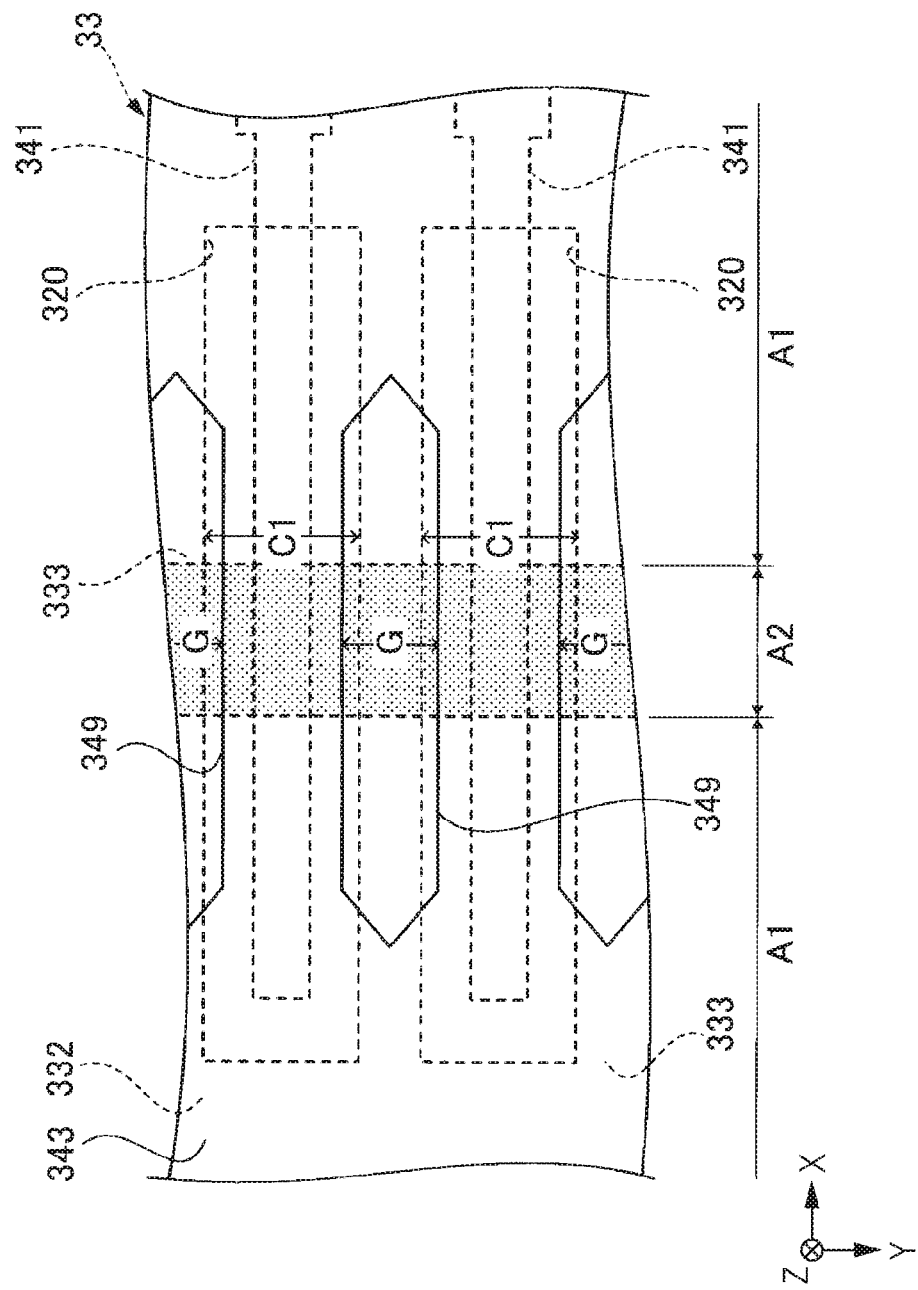
FIG. 30 is an enlarged plan view of a portion of a vibration plate in an eleventh embodiment.

FIG. 30 is an enlarged plan view of a portion of a vibration plate in the eleventh embodiment. In the first to tenth embodiments, the first area and the second area are alternately aligned in the Y direction, but the eleventh embodiment differs from the first to the eleventh embodiments in that the first area and the second area are aligned in the X direction. In other words, in the eleventh embodiment, the vibration plate 33 has the first area A1 and the second area A2 which is at a position different from the first area A1 in the X-axis direction and has a lower elastic modulus than an elastic modulus of the first area A1.

In particular, in the eleventh embodiment, the second area A2 is provided in the center of the pressure chamber C1 in the X direction, and the first area A1 is provided at a position other than the center in the pressure chamber C1 in the X direction (including an end portion in the X direction). In a vicinity of the X-direction center of the vibration plate 33 in the X direction, an amplitude (displacement amount) accompanying the vibration is large, and there is a possibility that a crack is likely to occur.

In view of this point, in the eleventh embodiment, an occurrence of a crack is reduced by providing the second area A2 at the X-direction center of the pressure chamber C1 and lowering an elastic modulus. On the other hand, discharge performance is maintained by providing the first area A1 at a position other than the X-direction center in which a crack is unlikely to occur and relatively increasing an elastic modulus.

A system in which areas with different elastic moduli are provided at different positions in the Y direction as described in the first to tenth embodiments may be combined with a system in which areas with different elastic moduli are provided at different positions in the X direction as described in the eleventh embodiment.

12. Modification Example

Each embodiment illustrated above can be variously modified. A specific modification aspect that can be applied to each embodiment described above will be illustrated below. Two or more aspects arbitrarily selected from the following examples can be appropriately combined within a mutually consistent range.

Figure 31:
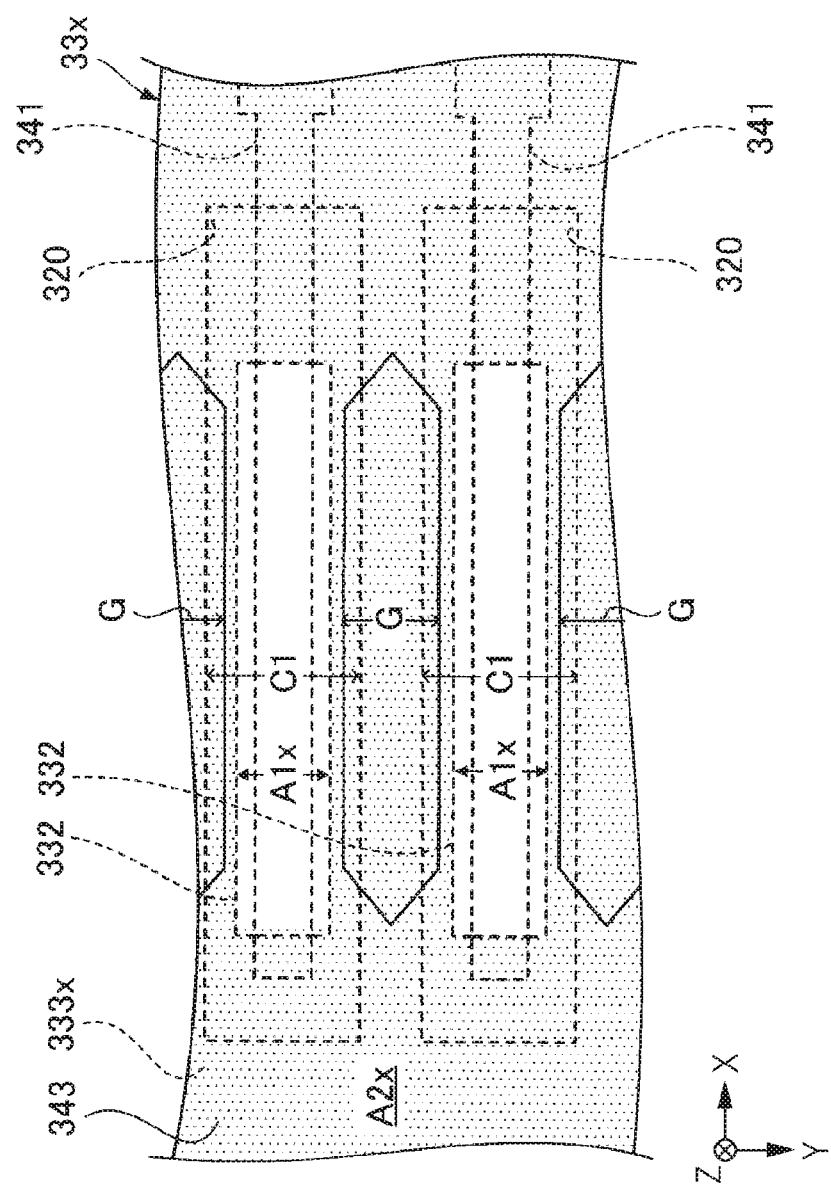
FIG. 31 is an enlarged plan view of a portion of a vibration plate in a modification example.

FIG. 31 is an enlarged plan view of a portion of a vibration plate 33x in the modification example. In the first embodiment, as illustrated in FIG. 6, the first area A1 surrounds the second area A2 in plan view, but as illustrated in FIG. 31, a second area A2x may surround a first area A1x in plan view. A third layer 333x overlaps the notch G in plan view. Further, a portion of the vibration plate 33x that overlaps the pressure chamber C1 in plan view and that is positioned between the first conductive layer 381 and the second conductive layer 382 illustrated in FIG. 4 in plan view, is easy to vibrate. Accordingly, the third layer 333x may be provided to overlap an edge on a side of the +X-axis of the first conductive layer 381 and an edge on a side of the −X-axis of the second conductive layer 382 in FIG. 4.

In each embodiment, the vibration plate 33 is constituted with a stacked body in which the first layer 331 and the second layer 332 are stacked, but other elements may be interposed between the first layer 331 and the second layer 332. Further, the second layer 332 may be omitted from the vibration plate 33.

In each embodiment, the first electrode 341 of the piezoelectric element 34 is used as an individual electrode and the second electrode 342 is used as a common electrode, but the first electrode 341 may be used as a common electrode and the second electrode 342 may be used as an individual electrode. Further, both the first electrode 341 and the second electrode 342 may be individual electrodes.

In each embodiment, the piezoelectric element 34 is a structure in which the first electrode 341, the piezoelectric body 343, and the second electrode 342 are stacked, but other elements may be interposed between the first electrode 341 and the piezoelectric body 343 to such an extent that the function as the piezoelectric element 34 is not impaired. Similarly, other elements may be interposed between the second electrode 342 and the piezoelectric body 343.

In the first embodiment, it is assumed that a crack would occur in the vibration plate 33 at the boundary between a portion of the vibration plate 33 that is in contact with the pressure chamber substrate 32 and a portion that is not in contact, or at the boundary between a portion of the vibration plate 33 that is in contact with the piezoelectric body 343 and a portion that is not in contact. Accordingly, the second area A2 is set to correspond to the boundaries, and the first area A1 is set to correspond to a portion other than the second area A2. However, when a crack is likely to occur in an area other than the boundary, the same effect as in the first embodiment described above can be obtained when the second area A2 is set in an area in which the crack is likely to occur. For example, when a crack is likely to occur in an area of the vibration plate 33 corresponding to the center of the pressure chamber C1 in a direction along the Y-axis, the area may be set as the second area A2. The same applies to other embodiments.

In each embodiment, the liquid discharge apparatus 100 of a serial method which reciprocates the transport body 242 mounted with the liquid discharge head 26 is illustrated, but it is possible that the present disclosure is also applied to a liquid discharge apparatus of a line method in which a plurality of nozzles N are distributed over the entire width of the medium 12.

The liquid discharge apparatus 100 illustrated in each embodiment can be employed in various apparatuses such as a facsimile apparatus and a copying machine in addition to an apparatus dedicated to printing. However, the application of the liquid discharge apparatus of the present disclosure is not limited to printing. For example, a liquid discharge apparatus that discharges a solution of a color material is used as a manufacturing apparatus for forming a color filter of a display apparatus such as a liquid crystal display panel. Further, a liquid discharge apparatus that discharges a solution of a conductive material is used as a manufacturing apparatus for forming a wiring and an electrode of a wiring substrate. Further, a liquid discharge apparatus that discharges a solution of an organic substance related to a living body is used, for example, as a manufacturing apparatus for manufacturing a biochip.

What is claimed is:

1. A liquid discharge head, comprising:
    a first substrate in which a nozzle is formed;
    a second substrate disposed above the first substrate;
    an energy generation element that generates energy for discharging a liquid by a drive signal being applied; and
    a vibration plate that vibrates by the energy generated by the energy generation element and that is stacked on the second substrate, wherein
    the vibration plate has a first area and a second area positioned at a position different from the first area and having a lower elastic modulus than an elastic modulus of the first area,
    the first area includes a first layer formed by a first material and a second layer formed by a second material,
    the second area includes a first layer formed by the first material and a third layer formed by a third material,
    the first material, the second material, and the third material are different materials,
    the first layer of the first area and the first layer of the second area have different thicknesses, and
    the first area and the second area have a substantially same thickness.

2. The liquid discharge head according to claim 1, wherein
in a space positioned between the first substrate and the vibration plate and formed by a wall surface of the second substrate, the second area is closer to the wall surface than the first area.

3. The liquid discharge head according to claim 2, wherein
the second area overlaps the wall surface in plan view viewed from a thickness direction of the vibration plate, and
the first area does not overlap the wall surface in the plan view.

4. The liquid discharge head according to claim 1, wherein
in a space positioned between the first substrate and the vibration plate and formed by a wall surface of the second substrate, the second area is closer to an end of the energy generation element than the first area.

5. The liquid discharge head according to claim 4, wherein
the second area overlaps the end of the energy generation element in plan view viewed from a thickness direction of the vibration plate, and
the first area does not overlap the end of the energy generation element in the plan view.

6. The liquid discharge head according to claim 1, wherein
the first area includes silicon oxide.

7. The liquid discharge head according to claim 1, wherein
the second area includes any of gold, silver, copper, platinum, iron, nickel, chromium, iridium, and tantalum.

8. A liquid discharge apparatus comprising:
the liquid discharge head according to claim 1; and
a control portion controlling operation of the liquid discharge head.

9. A method of manufacturing a liquid discharge head, comprising:
a first step of forming a first layer containing silicon oxide containing silicon;
a second step of stacking a zirconium-containing layer containing zirconium on the first layer;
a third step of stacking a resist film provided with an opening on the zirconium-containing layer;
a fourth step of removing a portion of the first layer and a portion of the zirconium-containing layer by etching using the resist film;
a fifth step of removing the resist film;
a sixth step of forming a second layer containing zirconium oxide by thermally oxidizing the zirconium-containing layer; and
a seventh step of forming a third layer having a lower elastic modulus than an elastic modulus of zirconium oxide on the first layer, wherein:
an area formed by the first layer and the second layer is a first area,
an area formed by the first layer and the third layer is a second area,
the first layer of the first area and the first layer of the second area have different thicknesses, and
the first area and the second area have a substantially same thickness.

10. The method of manufacturing a liquid discharge head according to claim 9, wherein
the third layer is stacked on the first layer and the second layer in the seventh step, and surfaces of the second layer and the third layer are planarized.

* * * * *